United States Patent
Fukano

(10) Patent No.: US 9,368,213 B2
(45) Date of Patent: *Jun. 14, 2016

(54) NONVOLATILE SEMICONDUCTOR MEMORY DEVICE WITH BLOCK DECODER

(71) Applicant: KABUSHIKI KAISHA TOSHIBA, Tokyo (JP)

(72) Inventor: Gou Fukano, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/688,664

(22) Filed: Apr. 16, 2015

(65) Prior Publication Data

US 2015/0294722 A1   Oct. 15, 2015

Related U.S. Application Data

(63) Continuation of application No. 13/784,512, filed on Mar. 4, 2013, now Pat. No. 9,053,765.

(30) Foreign Application Priority Data

Sep. 24, 2012  (JP) ................................ 2012-209501

(51) Int. Cl.
*G11C 16/04* (2006.01)
*G11C 16/08* (2006.01)
(Continued)

(52) U.S. Cl.
CPC ................. *G11C 16/08* (2013.01); *G11C 8/08* (2013.01); *G11C 8/10* (2013.01); *G11C 8/12* (2013.01);
(Continued)

(58) Field of Classification Search
CPC ......... G11C 16/08; G11C 16/10; G11C 16/16
USPC ............. 365/185.11, 230.03, 230.04, 230.08
See application file for complete search history.

(56) References Cited

U.S. PATENT DOCUMENTS 6,865,133 B2   3/2005   Tsukidate et al.
7,739,559 B2   6/2010   Suzuki et al.
(Continued)

FOREIGN PATENT DOCUMENTS

JP   2002133894 A   5/2002
JP   2007207425 A   8/2007
(Continued)

OTHER PUBLICATIONS

Taiwan Office Action dated May 4, 2015, filed in Taiwan counterpart Application No. 102126357, 11 pages (with translation).

(Continued)

*Primary Examiner* — Connie Yoha
(74) *Attorney, Agent, or Firm* — Patterson & Sheridan, LLP

(57) ABSTRACT

A nonvolatile semiconductor memory device includes a memory cell array having multiple blocks each with a plurality of memory strings. Each memory string has multiple memory cells connected in series between first and second selection transistors. The device further includes a row decoder, a block decoder, first and second signal line groups, and a switch circuit. The row decoder has transfer transistors through which voltages are supplied to the selection transistors. The block decoder supplies a selection signal that indicates whether the first group or the second group has been selected. The first and second signal line groups are connected to the selection transistors of the memory strings that are in the respective first and second memory blocks of the first and second groups. The switch circuit connects the first and second signal line groups to the respective first and second memory blocks of the selected group.

8 Claims, 13 Drawing Sheets

(51) Int. Cl.
*G11C 8/10* (2006.01)
*G11C 8/08* (2006.01)
*G11C 8/12* (2006.01)
*G11C 8/14* (2006.01)
*H01L 27/115* (2006.01)
*G11C 16/16* (2006.01)

(52) U.S. Cl.
CPC .............. *G11C 8/14* (2013.01); *G11C 16/0483* (2013.01); *H01L 27/11573* (2013.01); *H01L 27/11582* (2013.01); *G11C 16/16* (2013.01)

(56) References Cited

U.S. PATENT DOCUMENTS

| | | | |
|---|---|---|---|
| 9,053,765 B2* | 6/2015 | Fukano | G11C 8/10 |
| 9,136,005 B2* | 9/2015 | Choe | G11C 16/14 |
| 9,142,305 B2* | 9/2015 | Dunga | G11C 8/08 |
| 2005/0226048 A1 | 10/2005 | Lee | |
| 2007/0252201 A1 | 11/2007 | Kito et al. | |
| 2008/0310229 A1 | 12/2008 | Hamada | |
| 2011/0149659 A1* | 6/2011 | Goda | G11C 16/16 365/185.19 |
| 2011/0157989 A1 | 6/2011 | Iwata | |
| 2011/0267885 A1 | 11/2011 | Kato | |

FOREIGN PATENT DOCUMENTS

| | | |
|---|---|---|
| JP | 2010034109 A | 2/2010 |
| JP | 2012-146369 A | 8/2012 |

OTHER PUBLICATIONS

Japanese Office Action dated Jan. 27, 2015, filed in Japanese counterpart Application No. 2012-209501, 4 pages (with translation).

* cited by examiner

Block Decorder BD

Fig. 11

| The No. of Wirings | | | | |
|---|---|---|---|---|
| The No. of Shared BLK | 1 | 2 | 4 | 8 |
| Word Line WL | 24 | 24 | 24 | 24 |
| SGS | 12 | 24 | 48 | 96 |
| SGD | 12 | 24 | 48 | 96 |
| CG | 48 | 96 | 192 | 384 |
| BLKSEL | 1000 | 500 | 250 | 125 |
| BLKSELn | 1000 | 500 | 250 | 125 |
| Total No. of Wirings | 2096 | 1168 | 812 | 850 |

NONVOLATILE SEMICONDUCTOR MEMORY DEVICE WITH BLOCK DECODER

CROSS-REFERENCE TO RELATED APPLICATION(S)

This application is a continuation of U.S. patent application Ser. No. 13/784,512, filed on Mar. 4, 2013, which is based upon and claims the benefit of priority from Japanese Patent Application No. 2012-209501, filed on Sep. 24, 2012, the entire contents of each of which are incorporated herein by reference.

FIELD

Embodiments relate to control circuits of semiconductor memory devices.

BACKGROUND

In recent years, a semiconductor memory in which memory cells are laminated in stacked layers has been developed. This semiconductor memory provides high storage capacity at low cost. Increased miniaturization and higher storage densities cause various problems such as increasing sizes of related peripheral circuits in the memory device and associated wiring congestion as more memory cells are packed in smaller and smaller volumes.

BRIEF DESCRIPTION OF THE DRAWINGS

FIG. 10A illustrates an area occupied by a block decoder according to a comparative example;
FIG. 10B illustrates an area occupied by the block decoder according to the first embodiment when a sharing number n=2 is used;
and FIG. 10C illustrates an area occupied by the block decoder according to the first embodiment when the sharing number is n=4.
FIG. 11 is a table illustrating a reduction in the number of signal wirings according to the first embodiment.

DETAILED DESCRIPTION

Figure 1:
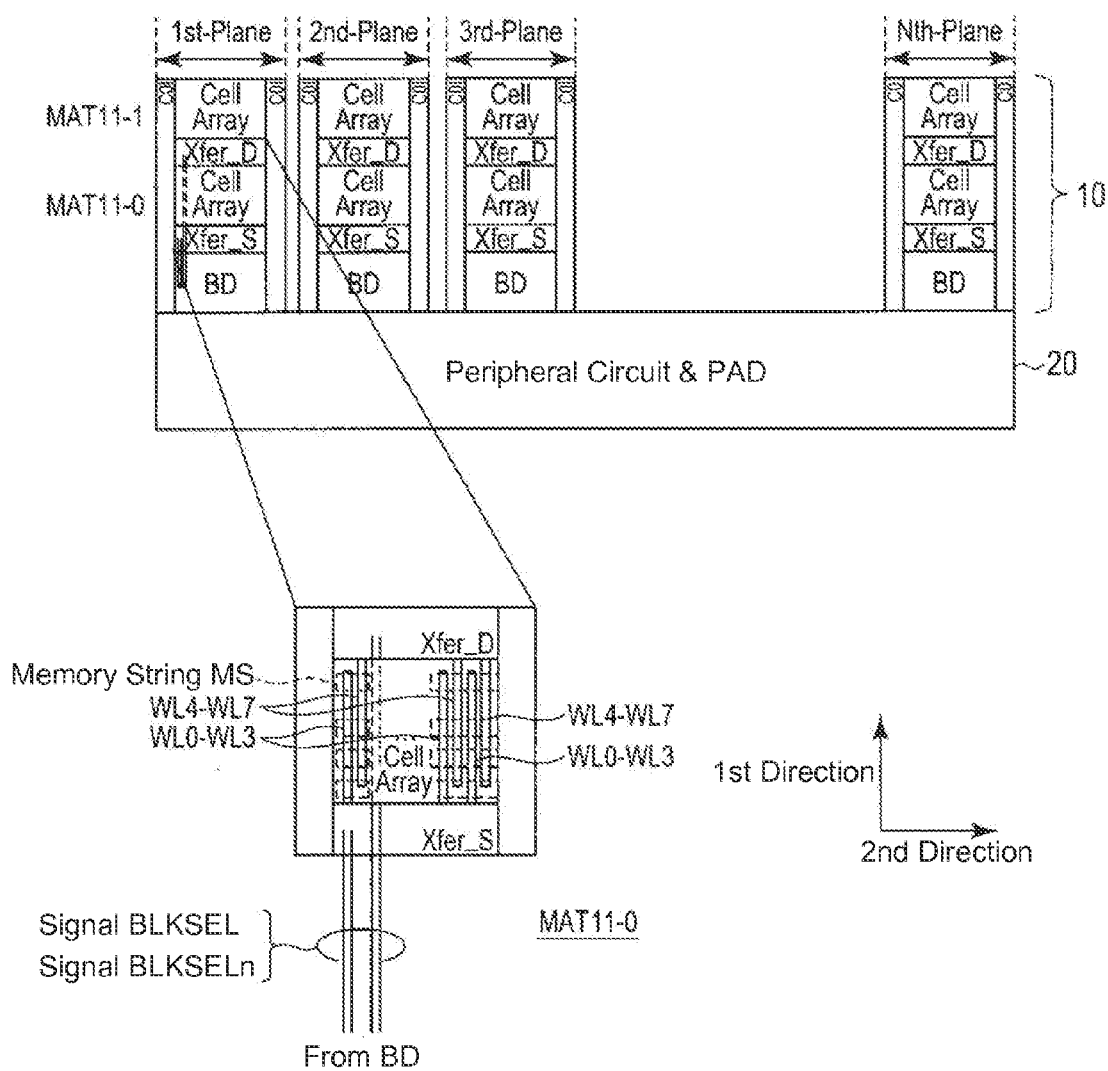
FIG. 1 illustrates an example of an overall configuration of a nonvolatile semiconductor memory device according to a first embodiment.

Embodiments related to the present disclosure describe a nonvolatile semiconductor memory device that allows the number of selection signals required for selecting a memory block to be reduced. A nonvolatile semiconductor memory device according to an embodiment includes a memory cell array, a row decoder, a block decoder, first and second signal line groups, and a switch circuit. The memory cell array has a plurality of memory blocks and each of the memory blocks has a plurality of memory strings. Each memory string has a plurality of memory cells connected in series, a first selection transistor connected to a first end of the plurality of memory cells connected in series, and a second selection transistor connected to a second end of the plurality of memory cells connected in series. The row decoder has transfer transistors through which voltages are supplied to the first and second selection transistors of the memory strings. The block decoder is configured to supply a selection signal to the transfer transistors, the selection signal indicating which of the first group of memory blocks and the second group of memory blocks has been selected. The first signal line group is connected to the first and second selection transistors of the memory strings that are in first memory blocks of the first and second groups. The second signal line group is connected to the first and second selection transistors of the memory strings that are in second memory blocks of the first and second groups. The switch circuit is configured to connect the first signal line group to the first memory block of the selected group and the second signal line group to the second memory block of the selected group.

In the following, the present embodiment is explained with reference to the drawings. In the following explanation, throughout all the drawings, common parts are indicated using common reference numerals or symbols. However, it should be noted that the drawings are schematic, and the relationship between a thickness and planar dimensions, the proportion of the thickness of each layer, and the like depicted are generally different from actual dimensions and relative proportions. Therefore, the specific thickness and dimensions should be determined by taking into consideration the following explanation rather than direct analysis of the drawing dimensions. Further, it should be readily understood that actual parts have dimensional relationships and proportions that are different than depicted in the drawings.

A nonvolatile semiconductor memory device according to the present embodiment can reduce the total number of wirings from a block decoder BD to a transfer circuit (XFER_D and XFER_S) (also referred to a transfer transistors) by sharing multiple blocks with a single block decoder BD.

First Embodiment

FIG. 1 illustrates an example of an overall configuration of a nonvolatile semiconductor memory device according to a first embodiment. As illustrated in FIG. 1, the nonvolatile semiconductor memory device according to the first embodiment is configured from a memory cell array 10 (1st Plane-Nth Plane in the drawing) and a peripheral circuit 20 capable of controlling the memory cell array 10.

As will described later, each of the 1st Plane-Nth Plane is capable of holding data and is provided with a plurality of laminated type memory cells MC stacked in a direction normal to a semiconductor substrate.

The peripheral circuit 20 includes a control unit controlling the 1st Plane-Nth Plane and a voltage generating circuit outputting various voltages when data writing, reading, erasing, and the like are performed. The control part and the voltage generating circuit are configured by various MOS transistors and signal lines and contact plugs CP supplying voltages to the MOS transistors. These MOS transistors, signal lines, contact plugs CP, and the like, are also generally arranged under the memory cell array 10.

Next, a plan view of the 1st Plane is explained. The other planes (2nd Plane 1-Nth Plane) have the same configuration as the 1st Plane and therefore their explanation is omitted.

As illustrated in the drawing, the 1st Plane is provided with MAT11-0 and MAT11-1 (either of which may be simply referred to as MAT11 when it is not required to distinguished one from the other), an XFER_S, an XFER_D, a column decoder COL (COL in the drawing) and a block decoder BD (BD in the drawing), the XFER_S and the XFER_D being arranged between those MAT11.

Each of MAT11-0 and MAT11-1 is provided with a plurality of memory strings MS. In a manner penetrating through these memory strings MS, word lines WL0-WL3 (referred to as the first signal line group in the following) and word lines WL4-WL7 (referred to as the second signal line group in the following) are formed extending in a first direction, and a plurality of bit lines BL (not illustrated in the drawings) are formed extending in a second direction.

An end of the word lines WL0-WL3 is connected to the XFER_S and an end of the word lines WL4-WL7 is connected to the XFER_D. That is, the word lines WL that penetrate through the MAT11 are arranged in a comb shape.

The XFER_D and the XFER_S are configured from a plurality of MOS transistors and select one of the memory strings MS in the MAT11. Specifically, upon receiving a control signal from the block decoder BD, the XFER_D and the XFER_S are capable of selecting a memory string MS that is a read, write or erase operation target.

The block decoder BD switches the MOS transistors in the XFER_S and the XFER_D on and off and selects the memory string MS of a write, read or erase operation target from the plurality of memory strings MS.

The column decoder COL selects a bit line BL (not illustrated in the drawings).

Cross-Sectional View of Memory Cell Array 10

Figure 2:
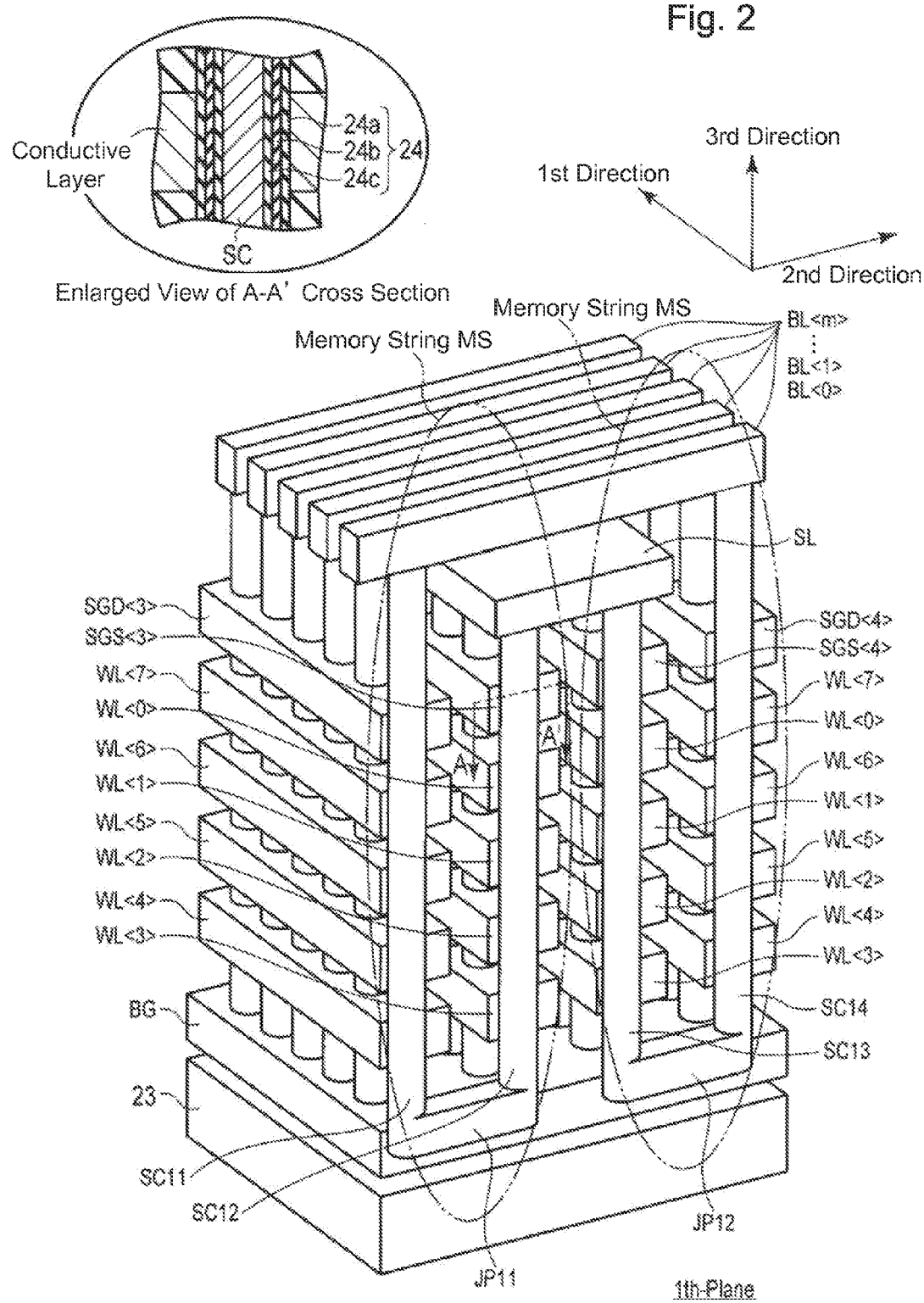
FIG. 2 illustrates a perspective view of a memory cell array according to the first embodiment.

FIG. 2 illustrates a three-dimensional perspective view of a structure of the memory strings MS that configure the 1st Plane. The structure of the 1st Plane illustrated here is the same as that of the 2nd Plane-Nth Plane, and therefore the explanation is given here with a focus on the 1st Plane as an example.

As illustrated in FIG. 2, in a plane formed by the first direction and the second direction, columnar semiconductor layers SC are formed in a matrix form (5×4, as depicted). A plurality of the semiconductor layers SC are formed on a semiconductor layer BG along a third direction that is orthogonal to the first direction and the second direction. Further, semiconductor layers SC that are mutually adjacent to each other along the second direction are joined via a joint part JP in the semiconductor layer BG. That is, the semiconductor layers SC that are mutually adjacent to each other form a U-shaped memory string MS via the joint part JP.

Therefore, semiconductor layers SC11, SC12, SC13, and SC14 are sequentially formed in the second direction. As depicted, the semiconductor layers SC11 and SC12 are joined by a joint part JP11 and the semiconductor layers SC13 and SC14 are joined by a joint part JP12. Along the first direction, other groups of semiconductor layers containing, for example, semiconductor layers SC21 and SC22 and semiconductor layers SC23 and SC24 that are formed in a manner adjacent to the semiconductor layers SC11, SC12, SC13 and SC14 also have a similar configuration and therefore their explanation is omitted. Further, in the present example embodiment, m=5 and n=4 are illustrated, but other numbers may be used.

Next, a structure of a memory cell MC is explained. Around the semiconductor layer SC, a gate insulating layer, an insulating layer (charge storage layer), and an insulating layer (blocking layer) that is formed from a material having a higher dielectric constant than the gate insulating layer are sequentially formed along the plane of the first direction and the second direction from the surface of the semiconductor layer SC. Next, at a region where the semiconductor layer SC is formed, and in the plane of the first direction and the second direction, the word lines WL that are formed along the first direction are formed in a plurality of layers extending in the third direction. That is, at an intersection region of a word line WL and the semiconductor layer SC, a memory cell MC is formed.

An enlarged cross-sectional view of a memory cell MC along an A-A' cross-sectional direction is illustrated in an upper left corner of FIG. 2. As illustrated in the drawing, a gate oxide film 24$c$, a charge storage layer 24$b$, and a blocking layer 24$a$ are sequentially formed from the surface of the semiconductor layer SC and covering the surface of the semiconductor layer SC. Further, a conductive layer is formed in a manner covering the surface of the blocking layer 24$a$. As described above, the memory string MS is formed in a U-shape. Therefore, with a drain side selection signal line SGD as a reference point (the drain side selection signal line SGD being provided above the uppermost word line WL layer), the word lines WL7, WL6, WL5 and WL4 are sequentially formed in layers below the drain side selection signal line SGD along the semiconductor layer SC11. On the other side of the joint part JP, word lines WL3, WL2, WL1, WL0 and a selection signal line SGS are sequentially formed from lower layers to upper layers along the semiconductor layer SC12.

That is, the word lines WL that are laminated in respective layers are separately formed between the adjacent semiconductor layers SC11 and SC12 and between the adjacent semiconductor layers SC13 and SC14 $t$ and are commonly connected between the semiconductor layers SC12-SC13 and between the semiconductor layers SC11-SC14.

Further, one end of the semiconductor layer SC12 that penetrates through the selection signal line SGS is connected to a source line SL. One end of the adjacent semiconductor layer SC13 is also connected to the source line SL. That is, adjacent semiconductor layers SC12 and SC13 are joined via the source line SL.

Further, one end of the semiconductor layer SC11 and one end of the semiconductor layer SC14 that penetrate through the selection signal lines SGD are commonly connected via a bit line BL1. Similarly, one end of the semiconductor layer SC21 and one end of the semiconductor layer SC24 that penetrate through the selection signal lines SGD are commonly connected via a bit line BL2; one end of the semiconductor layer SC31 and one end of the semiconductor layer SC34 are also commonly connected via a bit line BL3; and one end of the semiconductor layer SCm1 and one end of the semiconductor layer SCm4 are also commonly connected via a bit line BLm.

The structure of a memory strings MS formed via the semiconductor layers SC13 and SC14 is the same as the memory string MS formed via the semiconductor layers SC11 and SC12, and therefore the explanation thereof is omitted.

Here, the case where the memory cells MC0-MC7 are formed in each memory string MS is explained as an example. However, the number of the memory cells MC that configure a memory string MS is not limited to this number. The number of the memory cells MC may also be 16 and 32, for example. In the following, when necessary, the number of the memory cells MC may be s (where s is a natural number).

As illustrated in FIG. 2, the 1st Plane is configured by arranging the memory cells MC in a three dimensional matrix form. That is, the memory cells MC are arranged in a matrix form in a lamination direction (the $3^{rd}$ direction in FIG. 2) and are also arranged in a matrix form in a horizontal direction orthogonal to the lamination direction (the plane comprising the $1^{st}$ and $2^{nd}$ direction in FIG. 2). As described above, the plurality of the memory cells MC that are arranged in the lamination direction are connected in series to form memory strings MS. A memory block BLK is configured by an aggregate of the memory strings MS (for example, 12 memory strings MS). A plane P refers to an aggregate in which a plurality of the blocks BLK is formed. Multiple planes P can simultaneously have read, write, or erase operations performed on them.

The explanation about the memory string MS is continued next. A drain side selection transistor SGD (referred to as the selection transistor ST1 in the following) and a source side selection transistor SGS (referred to as the selection transistor ST2 in the following) that are put in a conduction state when selection is performed are connected to the two ends of the series connected memory cells MC. The memory string MS is arranged with the lamination direction as a longitudinal direction. One end of the selection transistor ST1 is connected to the bit line BL. One end of the selection transistor ST2 is connected to the source line SL.

Cross-Sectional View of One Block BLK

Figure 3:
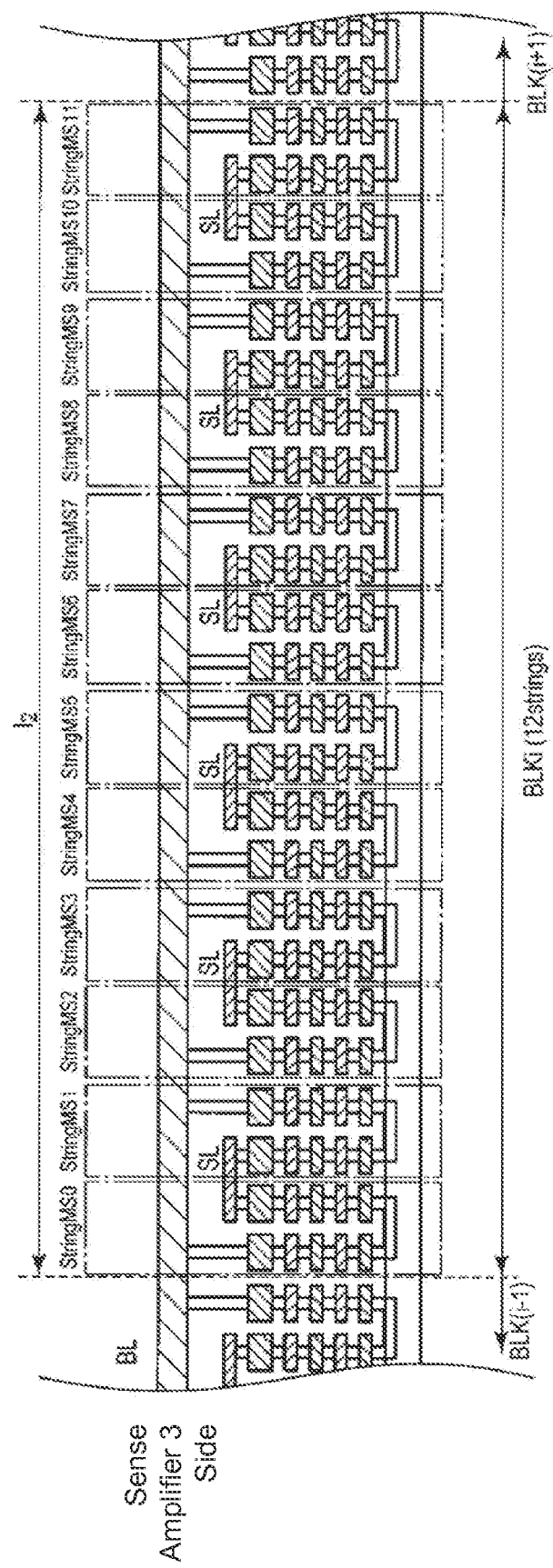
FIG. 3 illustrates a cross-sectional view of a memory string according to the first embodiment.

Next, the definition of the block BLK is explained using FIG. 3. FIG. 3 illustrates a cross-sectional view of the above-described memory cell array 10, with a focus here on the bit line BL0. However, in an actual configuration, the bit line BL1-bit line BLm are also formed in an array toward the back side of the paper.

As illustrated in the drawing, for example, a plurality of memory strings MS is electrically connected to the bit line BL0. In the present embodiment, for example, a unit configured by 12 memory strings MS is referred to as one block BLK.

That is, for example, a unit configured by memory strings MS0-MS11 is referred as a block BLK. For example, in a case where a plane PO is configured by the bit line BL0-bit line BLm, (m+1)×12 memory strings MS are formed per one block BLK. Further the source line SL is commonly connected between adjacent memory strings MS in the second direction.

Equivalent Circuit of Block BLK

Figure 4:
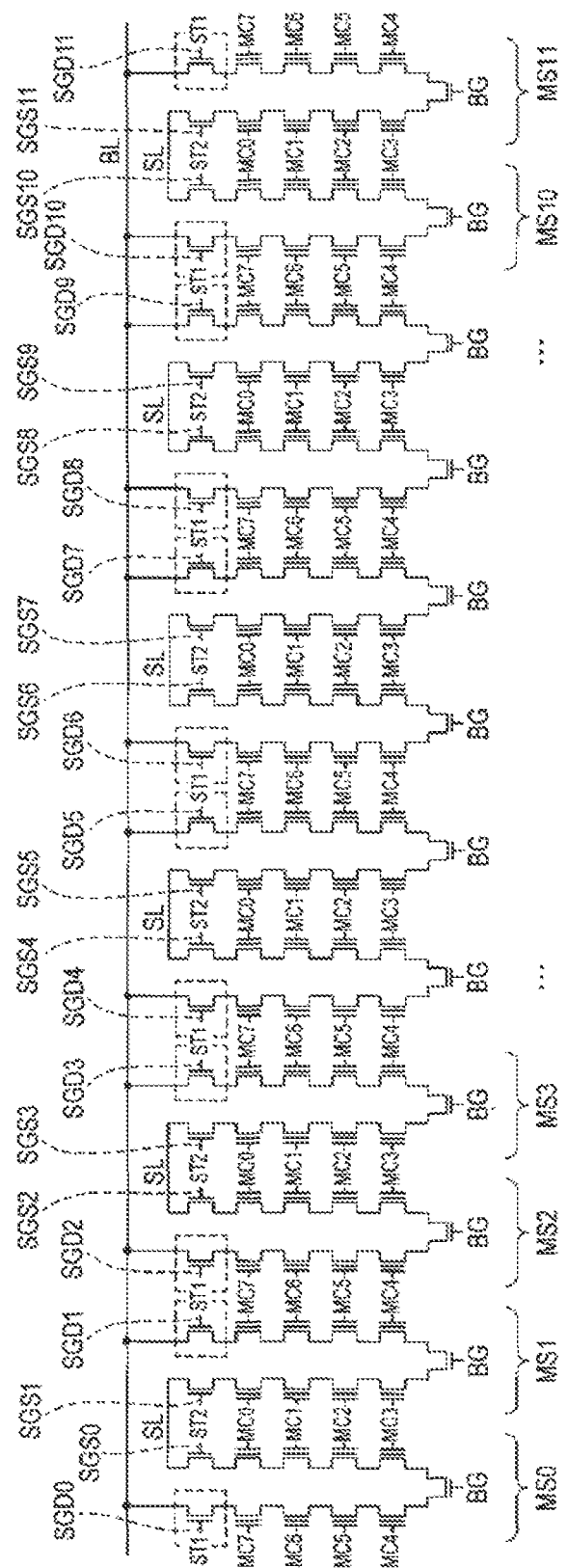
FIG. 4 illustrates an equivalent circuit of the memory string according to the first embodiment.

Next, a circuit diagram of the above-described memory string MS is explained using FIG. 4. The memory strings MS0-MS11 have the same configuration. Therefore, in the following, the explanation is given with a focus on the memory string MS0. Further, the number of the memory cells MC provided in each of the memory strings MS is 8 (s=8).

Memory String MS0

A circuit configuration of the memory string MS0 is explained next. The memory string MS0 is provided with the memory cell MC0-MC7, the selection transistor ST1 and the selection transistor ST2, as well as a transistor ST_BG.

Control gates CG of the memory cells MC0-MC7 also function as word lines WL.

That is, 8 word lines WL penetrate through the memory string MS0.

The memory cells MC0-MC3 are connected in series between the selection transistor ST2 and the selection transistor ST_BG.

The other end of a current path of the selection transistor ST2 is connected to the source line SL, and a signal SGS0 is supplied to a gate of the selection transistor ST2. Further, one end of a current path of the selection transistor ST_BG is connected to one end of a current path of the memory cell MC3 and a signal BG is supplied to a gate of the selection transistor ST_BG.

Further, the memory cells MC4-MC7 are connected in series between the selection transistor ST1 and the selection transistor ST_BG. The other end of a current path of the selection transistor ST1 is connected to the bit line BL0, and a signal SGD0 is supplied to a gate of the selection transistor ST1. Further, the other end of the current path of the selection transistor ST_BG is connected to one end of a current path of the memory cell MC4.

As described above, the memory strings MS1-MS11 have the same configuration as the memory string MS0, and therefore their explanation is omitted.

The gates of the memory cells MC0-memory cells MC7 provided in the memory string MS0-memory string MSk are commonly connected to form one block BLK.

Specifically, the control gates CG are commonly connected to control gates CG that configure all memory cells MC0 in memory string MS0-memory string MS11 that are connected to the other bit lines BL1-BLm (not illustrated in the drawing).

Detailed Connection Example of Memory Cell Array 10 and Peripheral Circuit 20

Figure 5:
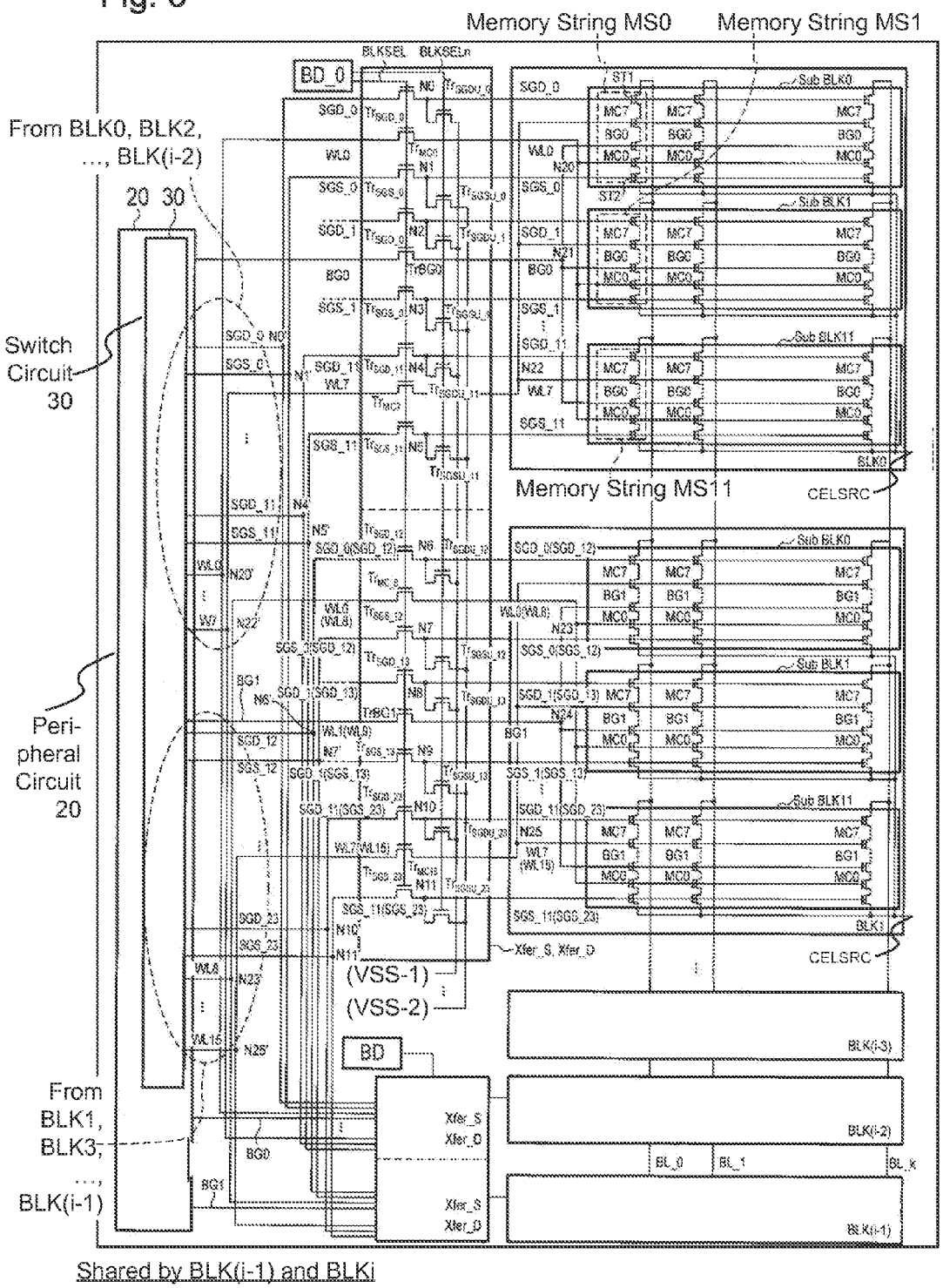
FIG. 5 illustrates a schematic diagram of blocks, an Xfer_S, an Xfer_D, and a peripheral circuit according to the first embodiment.

Next, a detailed connection example of the above-described memory cell array 10 and peripheral circuit 20 is explained using FIG. 5-FIG. 9. As illustrated in FIG. 5, the peripheral circuit 20 is provided with a switch circuit 30. In addition to the switch circuit 30, the peripheral circuit 20 is also provided with a voltage generating circuit, a sense amplifier, a driver circuit, a control part, and the like. Here, the explanation is given with a focus on the switch circuit 30.

Further, as an example, separate memory blocks are grouped in units of two to form a single memory block. That is, here block BLK0 and block BLK1 are grouped to form a single memory block BLK; block BLK2 and block BLK3 likewise form a single block BLK; and block BLK(i−2) and block BLK(i−1) are grouped to form one block BLK. In other words, it is assumed that every two blocks are grouped into a single memory block having two sub-blocks.

One block decoder BD is arranged for each of the group of the block BLK0 and the block BLK1, the group of the block BLK2 and the block BLK3; . . . , and the group of the block BLK(i−2) and the block BLK(i−1).

Thus, when i=1000, 500 block decoders BD are arranged. Further, back gate elements BG that configure the memory strings MS, and the like, are omitted. However, when every two blocks BLK are shared, selection and non-selection of the back gate element BG are controlled by two-block units.

The concept of a connection relation of the switch circuit 30 according to the present embodiment, the above-described memory cell array 10, and the Xfer_S and Xfer_D, is as follows.

Specifically, 24 signal lines SGS0-SGS23, 24 signal lines SGD0-SGD23 and 16 word lines WL0-WL15 that are connected via Xfer_S and Xfer_D from the BLK0-BLK(i-1) in the memory cell array 10 are connected to the switch circuit 30.

That is, the signal line SGS0, the signal line SGD0, . . . , the signal line SGS11, and the signal line SGD11 that are drawn from the block BLK0, the block BLK2, . . . , and the block BLK(i-2) are mutually joined via transfer transistors $Tr_{SGD\_0}$-$Tr_{SGD\_11}$ and transfer transistors $Tr_{SGS_{13}0}$-$Tr_{SGS\_11}$, and these groups of the signal lines SGS and the signal lines SGD are connected to the switch circuit 30 (here i=2 k, where k is a positive integer). Further, signals BLKSEL and BLKSELn are respectively supplied to gates of the transfer transistors $Tr_{SGD\_0}$-$Tr_{SGD\_11}$ and the transfer transistors $Tr_{SGS\_0}$-$Tr_{SGS\_11}$.

The signal line SGS12, the signal line SGD12, . . . , and the signal line SGS23 that are drawn from the block BLK1, the block BLK3, . . . , and the BLK(i-1) are mutually joined via the transfer transistors $Tr_{SGD\_0}$-$Tr_{SGD\_11}$ and the transfer transistors $Tr_{SGS\_0}$-$Tr_{SGS\_11}$, and these groups of the signal lines SGS and the signal lines SGD are connected to the switch circuit 30. Further, the signals BLKSEL and BLKSELn are respectively supplied to gates of the transfer transistors $Tr_{SGD\_0}$-$Tr_{SGD\_11}$ and the transfer transistors $Tr_{SGS\_0}$-$Tr_{SGS\_11}$.

The word line WL0-the word line WL7 that are drawn from the block BLK0, the block BLK2, . . . , the BLK(i-2) are joined between the memory strings MS in each block BLK, and thereafter, after passing through the transfer transistors $Tr_{MC\_0}$-$Tr_{MC\_7}$, are mutually joined, and these word lines WL0-WL7 are connected to the switch circuit 30. Further, the signal BLKSEL is supplied to gates of the transfer transistors $Tr_{MC\_0}$-$Tr_{MC\_7}$.

Further, the word line WL8-the word line WL15 that are drawn from the block BLK1, the block BLK3, . . . , and the block BLK(i-1) are also joined in the same way (that is, they are mutually joined after passing through the transfer transistors $Tr_{MC\_8}$-$Tr_{MC\_15}$), and these word lines WL are connected to the switch circuit 30. Further, the signal BLKSEL is also supplied to gates of the transfer transistors $Tr_{MC\_8}$-$Tr_{MC\_15}$.

In the following a specific connection relation is explained.

Connection Relation of Block BLK0 and Corresponding Xfer_S and Xfer_D

First, with a focus on the Sub-BLK0, the signal line SGD, the signal line SGS and a signal line CG are explained.

Signal Line SGD and Signal Line SGS

Sub-BLK0

A signal line SGD_0 connected to a gate of the selection transistor ST1 is connected to one end of a current path of a MOS transistor $Tr_{SGD\_0}$ at a node N0. Further, the signal line SGD_0 is connected to a node N0" via the other end of the MOS transistor $Tr_{SGD\_0}$.

Further, a signal line SGS_0 connected to a gate of the selection transistor ST2 is connected to one end of a current path of a MOS transistor $Tr_{SGS\_0}$ at a node N1. Further, the signal line SGS_0 is connected to a node N1' via the other end of the MOS transistor $Tr_{SGS\_0}$.

The same applies to signal lines SGD_1-SGD_11 and signal lines SGS_1-SGS_11. That is, the signal lines SGD_1-SGD_11 and the signal lines SGS_1-SGS_11 are also connected to the switch circuit 30 via corresponding MOS transistors $Tr_{SGD}$ and $Tr_{SGS}$.

Sub-BLK1-Sub-BLK11

In the above, the explanation is given with a focus on the Sub-BLK0. However, the same applies to the other Sub-BLK1-Sub-BLK11. That is, the selection lines (SGS_0 to SGS_11 and SGD_0 to SGD_11) that are drawn from the Sub-BLK1-the Sub-BLK11 are also connected to the switch circuit 30 via corresponding MOS transistors $Tr_{SGD}$ and $Tr_{SGS}$.

Word Line WL

Sub-BLK0

The word line WL0 connected to the memory cell MC0 is connected to one end (node N20) of a current path of the MOS transistor $Tr_{MC0}$. Further, the word line WL0 is connected to a node N20' via the other end of the current path of the MOS transistor $Tr_{MC0}$.

Sub-BLK1

The word line WL0 drawn from the Sub-BLK1 also is connected to the node N20 and to the node N20" via the MOS transistor $Tr_{MC0}$.

Here, the explanation is given with a focus on the word lines WL0 of the Sub-BLK0 and the Sub-BLK1. However, the same applies to the word lines WL0 drawn from the Sub-BLK2-the Sub-BLK11.

Further, the same applies to the word line WL1-the word line WL7 that are respectively drawn from each of the Sub-BLK0-the Sub-BLK11. For example, the word lines WL7 that are respectively drawn from the Sub-BLK0-the Sub-BLK11 are commonly connected at a node N22 and are connected to a node N22' via the corresponding MOS transistor $Tr_{MC7}$.

In this way, the word line WL1-the word line WL7 are also commonly connected between the Sub-BLK0-the Sub-BLK11, and then are connected to the switch circuit 30 via the corresponding MOS transistor $Tr_{MC1}$-MOS transistor $Tr_{MC7}$.

Connection Relation of BLK0, BLK2, . . . , and BLK(i-2)

Signal Line SGD and Signal Line SGS

First, the signal line SGD and the signal line SGS are explained. For example, the signal line SGD_0 that is drawn from the Sub-BLK0 in the block BLK0 and the signal lines SGD_0 that are each respectively drawn from the Sub-BLK0 in each of the blocks BLK2, BLK4, . . . , BLK(i-2) are commonly connected at a node N0'.

Similarly, for example, the signal line SGS_0 that is drawn from the Sub-BLK0 in the block BLK0 and the signal lines SGS_0 that are each respectively drawn from the Sub-BLK0 in each of the blocks BLK2, BLK4, . . . , BLK(i-2) are commonly connected at a node N1'. Similarly, the signal line SGD_11 that is drawn from the Sub-BLK11 in the block BLK0 and the signal lines SGD_11 that are each respectively drawn from the Sub-BLK11 in each of the blocks BLK2, BLK4, ..., BLK(i−2) are commonly connected at a node N4', and the signal line SGD_11 that is drawn from the Sub-BLK11 in the block BLK0 and the signal lines SGD_11 that are each respectively drawn from the Sub-BLK11 in each of the blocks BLK2, BLK4, ..., BLK(i−2) are commonly connected at a node N5'.

That is, a total of 12 signal lines SGD and 12 signal lines SGS that are commonly connected between the blocks BLK0, BLK2, ..., BLK(i−2) are connected to the switch circuit 30.

Word Line WL

Next, the word line WL is explained. For example, the word line WL0 that is drawn from the Sub-BLK0-Sub-BLK11 in the block BLK0 and the word lines WL0 that are each respectively drawn from the Sub-BLK0-Sub-BLK11 in each of the blocks BLK2, BLK4, ..., BLK(i−2) are commonly connected at the node N20'.

The same applies to the word lines WL1-WL7. That is, the word lines WL1-WL7 that are each respectively drawn from the Sub-BLK0-Sub-BLK11 in the block BLK0 and the word lines WL1-WL7 that are each respectively drawn from the Sub-BLK0-Sub-BLK11 in each of the blocks BLK2, BLK4, ..., BLK(i−2) are respectively commonly connected.

For example, as illustrated in FIG. 5, the word line WL7 that is drawn from the Sub-BLK0-Sub-BLK11 in the block BLK0 and the word lines WL7 that are each respectively drawn from the Sub-BLK0-Sub-BLK11 in each of the blocks BLK2, BLK4, ..., BLK(i−2) are commonly connected at a node N21'.

That is, a total of 8 word lines WL0-WL7 that are drawn from the block BLK0, block BLK2, block BLK4, ..., block BLK(i−2) and mutually joined are connected to the switch circuit 30.

Connection Relation of Block BLK1 and Corresponding Xfer_S and Xfer_D

Next, with a focus on the Sub-BLK0 in the block BLK1, the signal line SGD, the signal line SGS, and the signal line CG are explained.

Signal Line SGD and Signal Line SGS

Sub-BLK0

A signal line SGD_0 (also referred to as the signal line SGD_12 in the following) that is connected to the gate of the selection transistor ST1 is connected to one end of a current path of a MOS transistor $Tr_{SGD\_0}$ (also referred to as the MOS transistor $Tr_{SGD\_12}$ in the following) at a node N6. Further, this signal line SGD_12 is connected to a node N6' via the other end of the MOS transistor $Tr_{SGD\_12}$. Next, a signal line SGS_0 (also referred to as the signal line SGS_12 in the following) that is connected to the gate of the selection transistor ST2 is connected to one end of a current path of a MOS transistor $Tr_{SGS\_0}$ (also referred to as the MOS transistor $Tr_{SGS\_12}$ in the following) at a node N7. Further, the signal line SGD0 is connected to a node N7' via the other end of the MOS transistor $Tr_{SGS\_12}$.

The same applies to signal lines SGD13-SGD23 and signal lines SGS13-SGS23 in the other sub-blocks (e.g., sub-BLK1-sub-BLK11). That is, the signal lines SGD13-SGD23 and the signal lines SGS13-SGS23 are also connected to the switch circuit 30 via corresponding MOS transistors $Tr_{SGD}$ and $Tr_{SGS}$.

Sub-BLK1-Sub-BLK11

In the above, the explanation is given with a focus on the Sub-BLK0 in the block BLK1. However, the same applies to the Sub-BLK1-Sub-BLK11 in the block BLK1. That is, the signal lines SGD13-SGD23 and the signal lines SGS13-SGS23 that are drawn from the Sub-BLK1-Sub-BLK11 are also connected to the switch circuit 30 via corresponding MOS transistors $Tr_{SGD}$ and $Tr_{SGS}$.

Word Line WL

Sub-BLK0

A word line WL0 (also referred to as the word line WL8 in the following) that is connected to the memory cell MC0 is connected to one end (node N23) of a current path of a MOS transistor $Tr_{MC0}$ (also referred to as the MOS transistor $Tr_{MC12}$ in the following). Further, the word line WL8 is connected to a node N23' via the other end of the current path of the MOS transistor $Tr_{MC12}$.

Sub-BLK1

A word line WL0 (also referred to as the word line WL8 in the following) drawn from the Sub-BLK1 also is connected to the node N23 and to the node N23' via the MOS transistor $Tr_{MC8}$.

Here, the explanation is given with a focus on the word lines WL8 of the Sub-BLK0 and the Sub-BLK1. However, the same applies to the word lines WL8 drawn from the Sub-BLK2-the Sub-BLK11.

Further, the same applies to the word lines WL8-the word line WL15 that are respectively drawn from each of the Sub-BLK0-the Sub-BLK11. For example, the word lines WL15 that are respectively drawn from the Sub-BLK0-the Sub-BLK11 are commonly connected at a node N25 and are connected to a node N25' via the MOS transistor $Tr_{MC15}$.

In this way, the word line WL8-the word line WL15 are also commonly connected between the Sub-BLK0-the Sub-BLK11, and then are connected to the switch circuit 30 via the corresponding MOS transistor $Tr_{MC8}$-MOS transistor $Tr_{MC15}$.

Connection Relation of BLK1, BLK3, ..., BLK(i−1)

Signal Line SGD and Signal Line SGS

First, the signal line SGD and the signal line SGS are explained. For example, the signal line SGD_0 that is drawn from the Sub-BLK0 in the block BLK1 and the signal lines SGD_0 that are each respectively drawn from the Sub-BLK0 in each of the blocks BLK3, BLK5, ..., BLK(i−1) are commonly connected at a node N6'.

Similarly, for example, the signal line SGS_0 that is drawn from the Sub-BLK0 in the block BLK1 and the signal lines SGS_0 that are each respectively drawn from the Sub-BLK0 in each of the blocks BLK3, BLK5, ..., BLK(i−1) are commonly connected at a node N7'.

Similarly, a signal line SGD_11 (also referred to as the signal line SGD_23 in the following) that is drawn from the Sub-BLK0 in the block BLK1 and signal lines SGD_23 that are each respectively drawn from the Sub-BLK11 in each of the block BLK3, BLK5, ..., BLK(i−1) are commonly connected at a node N10'. A signal line SGS_11 (also referred to as the signal line SGS_23 in the following) that is drawn from the Sub-BLK0 in the block BLK1 and a signal line SGS_11 (also referred to as the signal line SGS_23 in the following) that is drawn from the Sub-BLK11 in each of the block BLK3, BLK5, . . . , BLK(i−1) are commonly connected at a node N11'.

That is, a total of 12 signal lines SGD and 12 signal lines SGS that are commonly connected between the blocks BLK1, BLK3, BLK5, . . . , BLK(i−1) are connected to the switch circuit 30.

As described above, a total of 24 signal lines SGD and 24 signal lines SGS, including 12 signal lines SGD and 12 signal lines SGS that are commonly connected between the BLK0, BLK2, . . . , BLK(i−2) and 12 signal lines SGD and 12 signal lines SGS that are commonly connected between the BLK1, BLK3, BLK5, . . . , BLK(i−1), are connected to the switch circuit 30.

Word Line WL

Next, the word line WL is explained. For example, the word line WL8 that is drawn from the Sub-BLK0-Sub-BLK11 in the block BLK1 and the word lines WL8 that are each respectively drawn from the Sub-BLK0-Sub-BLK11 in each of the blocks BLK2, BLK4, . . . , BLK(i−2) are commonly connected at the node N23".

The same applies to word lines WL9-WL15. That is, the word lines WL9-WL15 that are each respectively drawn from the Sub-BLK0-Sub-BLK11 in the block BLK1 and the word lines WL9-WL15 that are each respectively drawn from the Sub-BLK0-Sub-BLK11 in each of the blocks BLK2, BLK4, . . . , BLK(i−2) are respectively commonly connected. For example, as illustrated in FIG. 5, the word line WL15 that is drawn from the Sub-BLK0-Sub-BLK11 in the block BLK0 and the word lines WL15 that are each respectively drawn from the Sub-BLK0-Sub-BLK11 in each of the blocks BLK2, BLK4, . . . , BLK(i−2) are commonly connected at a node N25'.

That is, a total of 8 word lines WL8-WL15 that are drawn from the block BLK1, block BLK3, block BLK5, . . . , block BLK(i−1) and mutually joined are connected to the switch circuit 30.

Non-Selection MOS Transistor Tr

In the following, a non-selection MOS transistor Tr in the Xfer_S and the Xfer_D corresponding to the block BLK0 and the block BLK1 is explained. In FIG. 5, the Xfer_S and the Xfer_D are collectively illustrated. However, in practice, as illustrated in FIG. 1, the Xfer_S and the Xfer_D are arranged at two ends of the MAT11 in a manner sandwiching the MAT11.

When a corresponding memory string MS is not selected, the non-selection MOS transistor Tr in the Xfer_S and the Xfer_D is put in an ON state by the control of the block decoder BD; that is, the non-selection MOS transistor Tr in the Xfer_S and the Xfer_D has a function of transferring a ground potential to the selection transistors ST1 and ST2. The same applies to the non-selection MOS transistors Tr in the Xfer_S and the Xfer_D that correspond to each of the block BLK2 and block BLK3, . . . , and the block BLK(i−2) and block BLK(i−1), and therefore, the explanation of these non-selection MOS transistors Tr is omitted.

In the Xfer_S and the Xfer_D that correspond to the block BLK0 and block BLK1, a MOS transistor Tr group is provided in which a signal BLKSELn that the block decoder BD outputs is supplied to gates of the MOS transistor Tr group and a non-selection potential is supplied to one ends of current paths of the MOS transistor Tr group.

In the following, the connection relation is specifically explained. One end of a current path of a MOS transistor $Tr_{SGDU\_0}$ is supplied with a non-selection potential (VSS_1) and the other of the current path of the MOS transistor $Tr_{SGDU\_0}$ is commonly connected with the signal line SGD_0 at the node N0. Further, one end of a current path of a MOS transistor $Tr_{SGSU\_0}$ is supplied with a non-selection potential (VSS_2) and the other of the current path of the MOS transistor $Tr_{SGSU\_0}$ is commonly connected with the signal line SGS_0 at the node N1.

Further, one end of a current path of a MOS transistor $Tr_{SGDU\_1}$ is supplied with the non-selection potential (VSS_1) and the other of the current path of the MOS transistor $Tr_{SGDU\_1}$ is commonly connected with the signal line SGD_1 at the node N2, and one end of a current path of a MOS transistor $Tr_{SGSU\_1}$ is supplied with the non-selection potential (VSS_2) and the other of the current path of the MOS transistor $Tr_{SGSU\_1}$ is commonly connected with the signal line SGS_1 at the node N3.

Similarly, the same applies to MOS transistor $Tr_{SGDU\_2}$-MOS transistor $Tr_{SGDU\_23}$, and MOS transistor $Tr_{SGSU\_2}$-MOS transistor $Tr_{SGSU\_23}$.

That is, for example, one end of a current path of the MOS transistor $Tr_{SGDU\_23}$ is supplied with the non-selection potential (VSS_1) and the other of the current path of the MOS transistor $Tr_{SGDU\_23}$ is commonly connected with the signal line SGD_23 at the node N10, and one end of a current path of a MOS transistor $Tr_{SGSU\_23}$ is supplied with the non-selection potential (VSS_2) and the other of the current path of the MOS transistor $Tr_{SGSU\_23}$ is commonly connected with the signal line SGS_23 at the node N11.

In practice, the other ends of the current paths of the MOS transistor $Tr_{SGDU\_6}$-MOS transistor $Tr_{SGDU\_11}$, MOS transistor $Tr_{SGSU\_6}$-MOS transistor $Tr_{SGSU\_11}$, MOS transistor $Tr_{SGDU\_18}$-MOS transistor $Tr_{SGDU\_23}$, and MOS transistor $Tr_{SGSU\_18}$-MOS transistor $Tr_{SGSU\_23}$ are supplied with a potential (which is also a non-selection potential) that is different from the above-explained non-selection potentials (e.g., not a ground potential).

Block Decoder BD

Next, the block decoder BD is explained. As described above, a block decoder BD is provided for every two blocks BLK (for example, the group of block BLK0 and block BLK1, . . . , the group of block BLK(i−2) and block BLK(i−1)). That is, for i blocks BLK, there exist block decoder BD_1-block decoder BD_(i−1)/2.

These block decoders BD select or unselect the blocks BLK. Specifically, when the signal BLKSEL that the block decoders output is set at a "H" level (e.g., a high level), the MOS transistors $Tr_{SGD\_0}$-$Tr_{SGD\_23}$, the MOS transistors $Tr_{SGS\_0}$-$Tr_{SGS\_23}$ and the MOS transistors $Tr_{MC0}$-$Tr_{MC95}$ are put in the ON state and the corresponding blocks BLK are selected.

On the other hand, when the signal BLKSELn that the block decoders output is put at the "H" level, the MOS transistors $Tr_{SGDU\_0}$-$Tr_{SGDU\_23}$ and the MOS transistor $Tr_{SGSU\_0}$-$Tr_{SGSU\_23}$ are put in the ON state, and the corresponding blocks BLK are put in a non-selection (unselected) state.

That is, among the blocks BLK of the block BLK0-block BLK(i−1), the signal BLKSEL that is output by the block decoders BD corresponding to the blocks BLK in a selection state is put at the "H" level. The other block decoders BD output the signal BLKSELn at the "H" level.

Structure of Block Decoder BD

Figure 6:
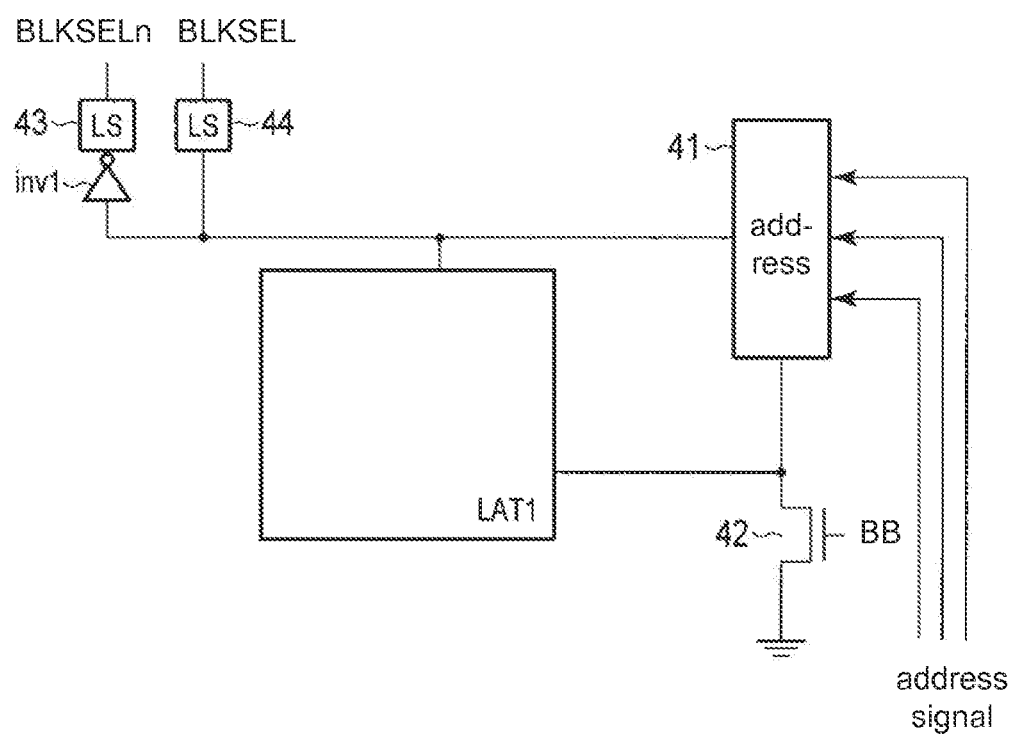
FIG. 6 is a block diagram of a block decoder according to the first embodiment.
Figure 7:
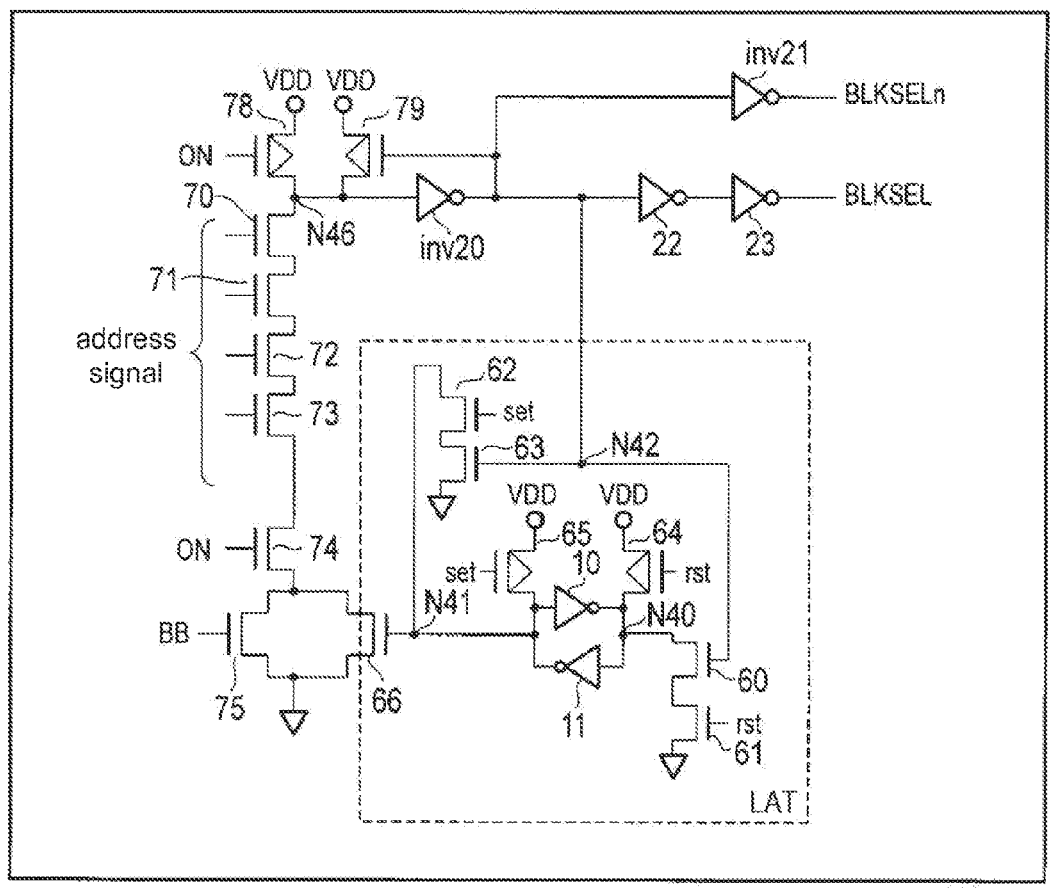
FIG. 7 illustrates a circuit diagram of the block decoder according to the first embodiment.

Next, the structure of a block decoder BD and equivalent circuit are explained using FIG. 6 and FIG. 7. FIG. 6 illustrates a block diagram of a block decoder BD. FIG. 7 illustrates an equivalent circuit of the block decoder BD.

The block decoder BD is explained using FIG. 6. Here, a case where 4 blocks BLK are shared is explained as an example. That is, for example, the block BLK0, block BLK1, block BLK2 and block BLK3 are in one aggregate, and one block decoder BD is provided for these four blocks BLK.

As illustrated in FIG. 6, the block decoder BD is provided with a latch circuit LAT1, an address decoder unit 41, a MOS transistor 42, a level shifter 43, and a level shifter 44.

Latch Circuit LAT1

The latch circuit LAT1 holds data that indicates whether a corresponding block BLK (for example, BLK0-BLK3) is defective. Specifically, when the corresponding block BLK is defective, the latch circuit LAT1 holds a "L" level (e.g., a low level). On the other hand, when the corresponding block BLK is non-defective, the latch circuit LAT1 holds the "H" level. Here, for example, when the block BLK2 is defective, the latch circuit LAT1 holds the "L" level. When all corresponding blocks BLK are considered as defective, the latch circuit LAT1 holds the "L" level, and on the other hand, when any one block BLK among the corresponding blocks BLK is considered as non-defective and other remaining blocks BLK are considered as defective, the latch circuit LAT1 can stop the latch function.

Address Decoder 41

Next, the address decoder 41 is explained. A plurality of address signals (indicated as "address signal" in the drawing) are input to the address decoder 41. As described above, the block decoder BD is provided for a unit of four blocks BLK. The address signal includes the number of bits necessary for selecting, for example, each of the four blocks BLK of an aggregate unit of all the blocks BLK.

For example, when a signal address indicating the block BLK0 is input, the block decoder BD outputs the signal BLKSEL="H" level and the signal BLKSELn="L" level.

On the other hand, for example, when any of the block BLK0-block BLK3 is not selected, the block decoder BD outputs the signal BLKSEL="L" level and the signal BLKSELn="H" level.

Level Shifters LS43 and LS44

The level shifter LS43 outputs the signal BLKSELn based on an input signal that is inverted by an inverter inv1, and the level shifter LS44 outputs the signal BLKSEL based on the input signal. These level shifters LS43 and LS44 boost, for example, an input voltage VDD up to a write voltage or a read voltage. Therefore, the signal BLKSEL and the signal BLKSELn are generally high voltage signals.

Equivalent Circuit of Block Decoder BD

Next, an equivalent circuit of the above-described block decoder BD is explained using FIG. 7.

Latch Circuit LAT1

The latch circuit LAT1 is explained next. In the following, when necessary, the latch circuit LAT1 may be explained as corresponding to the block BLK0-block BLK3. The latch circuit LAT1 is provided with n-channel MOS transistors 60-63, p-channel MOS transistors 64 and 65, an inverter inv10, and an inverter inv11.

One end of a current path of the MOS transistor 60 is connected to a node N40, and a node N42 is connected to a gate of the MOS transistor 60. One end of a current path of the MOS transistor 61 is connected to the other end of the current path of the MOS transistor 60; a signal RST is supplied to a gate of the MOS transistor 61; and the other end of the current path of the MOS transistor 61 is grounded. That is, when the MOS transistors 60 and 61 are put in an ON state, the node N40 is put at the "L" level.

One end of a current path of the MOS transistor 62 is connected to a node N41; the other end of the current path of the MOS transistor 62 is connected to one end of a current path of the MOS transistor 63; and a signal SET is supplied to a gate of the MOS transistor 62. Further, the other end of the current path of the MOS transistor 63 is grounded, and a gate of the MOS transistor 63 is connected to the node N42. That is, when the MOS transistor 62 and the MOS transistor 63 are all put in the ON state, the node N41 is put at the "L" level.

The voltage VDD is supplied to one end of a current path of the MOS transistor 64; the signal RST is supplied to a gate of the MOS transistor 64; and the other end of the current path of the MOS transistor 64 is connected to the node N40. Further, the voltage VDD is supplied to one end of a current path of the MOS transistor 65; the signal SET is supplied to a gate of the MOS transistor 65; and the other end of the current path of the MOS transistor 65 is connected to the node N41.

Next, the inverters inv10 and inv11 are explained. A holding part is configured by the inverters inv10 and inv11. That is, an output terminal of the inverter inv10 is connected to an input terminal of the inverter inv11, and an output terminal of the inverter inv11 is connected to an input terminal of the inverter inv10.

In the following, a signal that is input to the latch circuit LAT1 when the corresponding block BLK0-block BLK3 are all defective and a signal that is input to the latch circuit LAT1 when some of the blocks BLK are determined to be defective (the rest of the blocks BLK are determined to be non-defective) are explained. First, MOS transistors 74 and 75 are explained.

When all blocks BLK are selection targets, a gate signal ON that is supplied the MOS transistor 74 is activated (in this case, the MOS transistors 70-73 are also in the ON state).

Further, when a defective block BLK becomes a target, a gate signal BB that is supplied to the MOS transistor 75 is temporarily activated at a stage before the block BLK becomes a selection target. However, while the block BLK is selected, the gate signal BB is fixed at a low voltage and the MOS transistor 75 is put in an OFF state.

When All Block BLK0-Block BLK3 are Considered as Defective

In this case, the signal SET="H" level and the signal RST="L" level are input. As a result, the potential level of the node N41 transitions to the "L" level.

Therefore, even in the case where MOS transistor 70-MOS transistor 74 (to be described later) are all erroneously put in the ON state despite being defective block BLK targets, since a MOS transistor 66 is put in the OFF state, a node N46 does not transition to the "L" level.

That is, the signal BLKSELn is put at the "H" level and the non-selection potential is supplied to the block BLK0-block BLK3. In other words, the block BLK0-block BLK3 are not selected.

When Blocks BLK are Divided into Defective Blocks BLK and Non-Defective Blocks BLK On the other hand, when some of the block BLK0-block BLK3 are non-defective, and the blocks BLK are divided into defective blocks BLK and non-defective blocks BLK, the latch circuit LAT1 is not operated. That is, an initial state when the nonvolatile semiconductor memory device is powered up is maintained. Specifically, the signal RST="H" level and the signal SET="L" level are input. This allows the node N41 to transition to the "H" level and then, as described above, this allows the MOS transistor 70-MOS transistor 74 to be put in the ON state.

As will be described later, a write voltage, a read voltage, and the like are transferred to selection blocks among the shared blocks BLK by a switch circuit 30. A write voltage, a read voltage, and the like are not transferred to defective blocks BLK and non-selection blocks BLK.

Address Decoder 41

Next, the address decoder part 41 is explained. The address decoder part 41 is provided with n-channel MOS transistors 70-75 and p-channel MOS transistors 78 and 79. The MOS transistors 70-75 are mutually connected at their drains and sources in a manner to be connected in series.

The above-described signal address is supplied to gates of the MOS transistor 70-73. When any one of the block BLK0-BLK3 is selected, all of the MOS transistors 70-73 are put in the ON state by the signal address.

Next, when the signal ON="H" level and the above-described MOS transistor 66 is put in the ON state, the node N46 transitions to the "L" level. Therefore, an "H" level signal as the signal BLKSEL is output from the inverter inv23.

On the other hand, when all of the block BLK0-block BLK3 are in the non-selection state, the signal ON is put at the "L" level and the potential of the node N46 is put at the "H" level. Therefore, an "H" level signal BLKSELn is output via the inverters inv20 and inv21.

Inverters inv20, inv21 and inv22

The node N46 is connected to an input terminal of the inverter inv20. The inverter inv20 outputs a result obtained by inverting the potential level of the node N46 to the node N42 (an input terminal of the inverter inv21).

The inverter inv21 receives the potential level of the node N42 and outputs as the signal BLKSELn a result obtained by inverting this potential level to the block decoder BD.

Further, the inverter inv22 inverts the potential level of the node N42 and outputs the result of the inversion to the inverter 23. Upon receiving the input from the inverter 22, the inverter 23 inverts the voltage level supplied from the inverter 22 and outputs the result of the inversion as the signal BLKSEL.

Switch Circuit 30

Figure 8:
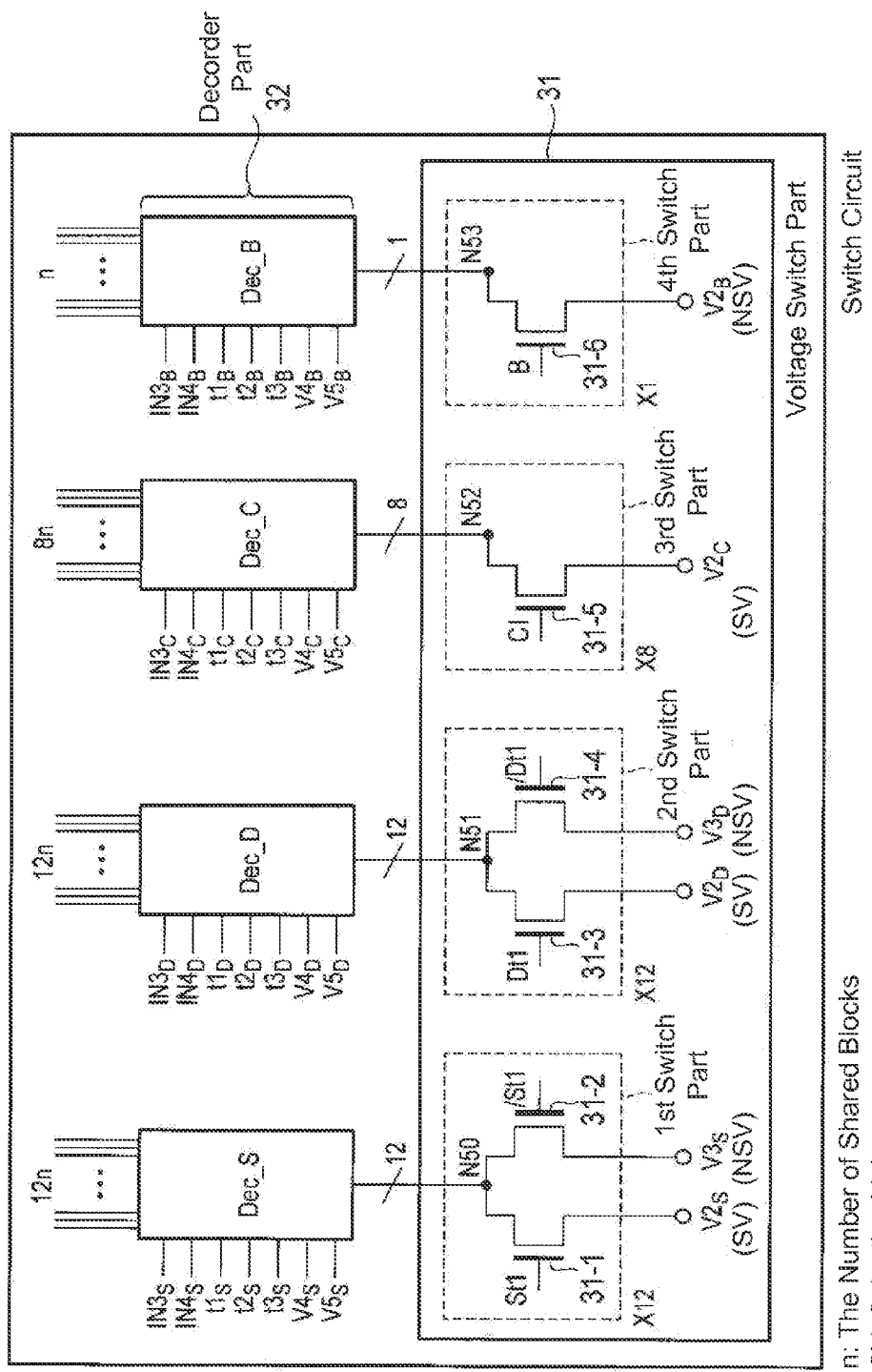
FIG. 8 illustrates a circuit diagram of a switch circuit according to the first embodiment.
Figure 9:
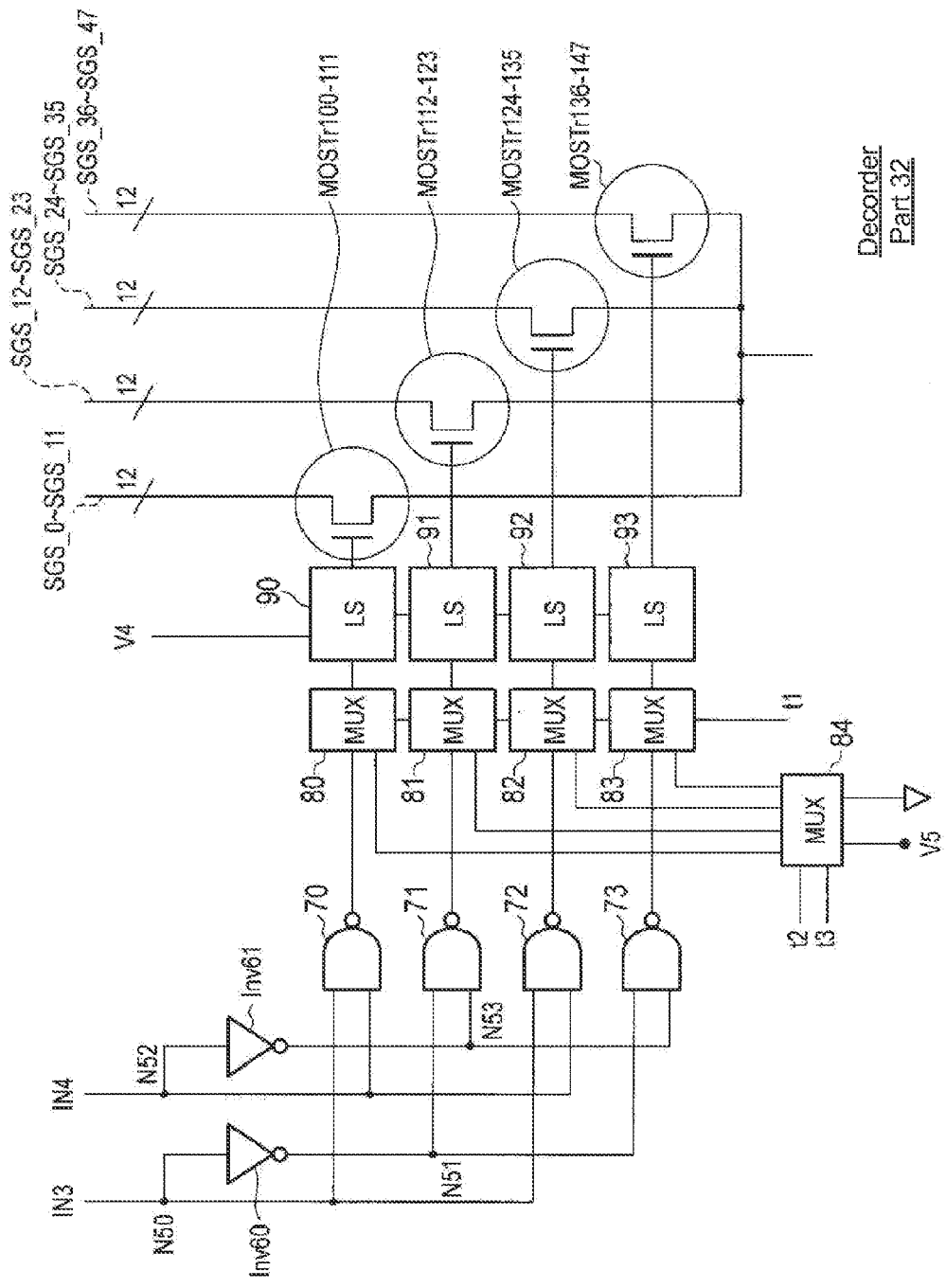
FIG. 9 illustrates a circuit diagram of a decoder part according to the first embodiment.

Next, the switch circuit 30 is explained using FIG. 8 and FIG. 9. The switch circuit 30 is configured primarily from a voltage switch part 31 and a decoder part 32.

Voltage Switch Part 31

The voltage switch part 31 is provided with first switch parts through fourth switch parts. In the present example, only one of each set of the switch parts is illustrated and all others are omitted. However, of the first switch parts through the fourth switch parts, for each set of the first switch parts and the second switch parts, 12 switch parts are originally provided for selecting one block BLK (12 memory strings MS) (in the drawing, the wiring that connects the switch part and the decoder part is indicated with a label "12"). Here, the "t-th" (t: 0-11) first switch part and the "t-th" (t: 0-11) second switch part are illustrated.

Further, 8 third switch parts are provided for applying voltage to the 8 word lines WL that form one memory string MS (in the drawing, the wiring that connects the switch part and the decoder part is indicated with a label "8"). The third switch parts also have the same structures. Therefore, only one switch part is illustrated. Here, the "l-th" (l: 0-7) third switch part is illustrated.

Further, since it is sufficient to select one block BLK among i blocks BLK that are provided, only one fourth switch part is provided.

First Switch Part

The first switch part is provided with n-channel MOS transistor 31-1 and MOS transistor 31-2. A voltage $V2_S$ (for example, voltage VDD) is supplied to one end of a current path of the MOS transistor 31-1; a signal St1 (t: 0-11) is supplied to a gate of the MOS transistor 31-1; and the other end of the current path of the MOS transistor 31-1 is connected to a node N50.

When the signal St1 is put in the "H" level, the voltage $V2_S$ is supplied to one of the signal line SGS_0-signal line SGS_11 or the signal line SGS_12-signal line SGS_23. In other words, the selection transistor ST2 of the corresponding memory string MS is put in the selection state.

Further, a voltage $V3_S$ is supplied to one end of a current path of the MOS transistor 31-2; a signal St1 (where "I" indicates inversion; that is, the signal /St1 is an inverted signal of the signal St1) is supplied to a gate of the MOS transistor 31-2; and the other end of the current path of the MOS transistor 31-2 is connected to the node N50.

That is, when the signal /St1 is put in the "H" level, the voltage $V3_S$ is supplied to one of the signal line SGS_0-signal line SGS_11 or the signal line SGS_12-signal line SGS_23. In other words, the corresponding memory string MS is not selected.

Second Switch Part

Next, the second switch part is explained. It is necessary to select or not-select a predetermined memory string MS. Therefore, a signal line SGD that forms a pair with the above signal line SGS that is selected by the first switch part is selected by the second switch part. The same applies to the memory string MS that is put as not-selected.

The second switch part is provided with n-channel MOS transistors 31-3 and 31-4. A voltage $V2_D$ is supplied to one end of a current path of the MOS transistor 31-3; a signal Dt1 is supplied to a gate of the MOS transistor 31-3; and the other end of the current path of the MOS transistor 31-3 is connected to a node N51.

When the signal Dt1 is put in the "H" level, the voltage $V2_D$ is supplied to one of the signal line SGD_0-signal line SGD_11 or the signal line SGD_12-signal line SGD_23. In other words, the selection transistor ST1 of the corresponding memory string MS is put in the selection state.

Further, a voltage $V3_D$ is supplied to one end of a current path of the MOS transistor 31-4; a signal /Dt1 is supplied to a gate of the MOS transistor 31-4; and the other end of the current path of the MOS transistor 31-4 is connected to the node N51.

That is, when the signal /Dt1 is put in the "H" level, the voltage $V3_D$ is supplied to one of the signal line SGD_0-signal line SGD_11 or the signal line SGD_12-signal line SGD_23. In other words, the corresponding memory string MS is not selected.

Third Switch Part

The third switch parts are provided in number corresponding to the number of the word lines WL0-WL7 as described above. However, only one of the third switch parts is illustrated here.

As illustrated in the drawing, the third switch part is provided with an n-channel MOS transistor 31-5. A voltage $V2_C$ (for example, a write operation voltage, a read operation voltage, an erase operation voltage) is supplied to one end of a current path of the MOS transistor 31-5; a signal C1 is supplied to a gate of the MOS transistor 31-5; and the other end of the current path of the MOS transistor 31-5 is connected to a node N52.

This allows, for example, in the case of a write operation, a write operation voltage that is supplied from the MOS transistor 31-5 to be supplied to the word lines WL in any one memory string MS in any one block BLK. The same applies to the case of a read operation voltage and the case of an erase operation voltage.

Fourth Switch Part

Next, the fourth switch part is explained. As described above, with respect to the first-third switch parts, only one fourth switch part is provided.

As illustrated in the drawing, the fourth switch part is provided with an n-channel MOS transistor 31-6. A voltage $V2_B$ (for example, a potential that puts the transistor ST_BG in the ON state, such as a write operation non-selection voltage and a read operation non-selection potential) is supplied to one end of a current path of the MOS transistor 31-6; a signal B is supplied to a gate of the MOS transistor 31-6; and the other end of the current path of the MOS transistor 31-6 is connected to a node N53.

This allows, for example, in the case of a write operation, the write operation non-selection voltage $V2_B$ that is supplied from the MOS transistor 31-6 to be supplied to the gate of the selection transistor ST_BG of any one block BLK. The same applies to the case of a read operation voltage and the case of an erase operation voltage.

Decoder Part 32

The decoder part 32 is provided with a decoder Dec_S, a decoder Dec_D, a decoder Dec_B, and a decoder Dec_C, as depicted in FIG. 8. In the following, the explanation is given assuming the case where the number of sharing blocks is n=4. That is, the signal lines SGS (a total of 48 of them) that are drawn from, for example, the block BLK0-block BLK3 are connected to the decoder Dec_S.

Similarly, the signal lines SGD (a total of 48 of them) that are drawn from the block BLK0-block BLK3 are connected to the decoder Dec_D. Next, the signal lines CG (a total of 32) that are drawn from, for example, the block BLK0-block BLK3 are connected to the decoder Dec_C.

Decoder Dec_S

Signals $IN3_S$, $IN4_S$, $t1_S$, $t2_S$ and $t3_S$ and voltages $V4_S$ and $V5_S$ are supplied to the decoder Dec_S. The decoder Dec_S receives the signal $IN3_S$ and the signal $IN4_S$, and then decodes the signal $IN3_S$ and the signal $IN4_S$. Depending on the result of the decoding, the decoder Dec_S selects, from the 12×4 signal lines SGS, the signal lines SGS corresponding to a particular block BLK to apply the voltage from the first switch part.

The voltage $V4_S$ is supplied to a level shifter that is provided in the decoder Dec_S. Next, signal processing operations up to a MUX circuit 84 and MUX circuits 80-83 of FIG. 9 are explained, the MUX circuits 80-83 are signal output destinations of the MUX circuit 84. Since a defective cell may exist among the selected four blocks BLK, operations to a block BLK that cannot be used are prohibited. However, in the nonvolatile semiconductor memory device according to the first embodiment, the signal BLKSEL transfers data over all the SG lines, the CG lines and the BG lines of the shared blocks BLK. Therefore, it is necessary to set the voltage of the non-selection state in the circuit of FIG. 9.

Once a potential of selection or non-selection is provided to the SG lines, the CG lines and the BG lines at the stage of the circuit of FIG. 9, there will be no problem even when data transfer via the signal BLKSEL becomes possible in the Xfer_S or Xfer_D circuit which is the next circuit of FIG. 9.

Which block BLK is access enabled or access prohibited is supplied to the signal $t_2$. This signal stores data in a ROM in advance and transfers the data from the ROM. The signal $t_2$ reaches each BLK via wiring that is independent for each block BLK from the MUX circuit 84.

Decoder Dec_D

Signals $IN3_D$, $IN4_D$, $t1_D$, $t2_D$ and $t3_D$ and voltages $V4_D$ and $V5_D$ are also similarly supplied to the decoder Dec_D. The decoder Dec_D receives the signal $IN3_D$ and the signal $IN4_D$, and then decodes the signal $IN3_D$ and the signal $IN4_D$.

Depending on the result of the decoding, the decoder Dec_D selects, from the 12×4 signal lines SGD, the signal lines SGD corresponding to a particular block BLK to apply the voltage from the second switch part. The voltage $V4_D$ is supplied to a level shifter that is provided in the decoder Dec_D. Connection method from the MUX circuit 84 to the MUX circuits 80-83 is the same as explained for the decoder Dec_S and thus the explanation thereof is omitted.

Decoder Dec_C

Signals $IN3_C$, $IN4_C$, $t1_C$, $t2_C$ and $t3_C$ and voltages $V4_C$ and $V5_C$ are also similarly supplied to the decoder Dec_C. The decoder Dec_C receives the signal $IN3_C$ and the signal $IN4_C$, and then decodes the signal $IN3_C$ and the signal $IN4_C$.

Depending on the result of the decoding, the decoder Dec_C selects, from the 8×4 signal lines CG, the signal lines CG corresponding to a particular block BLK to apply the voltage from the third switch part. The voltage $V4_C$ is supplied to a level shifter that is provided in the decoder Dec_C.

Decoder Dec_B

Signals $IN3_B$, $IN4_B$, $t1_B$, $t2_B$ and $t3_B$ and voltages $V4_B$ and $V5_B$ are also similarly supplied to the decoder Dec_B. The decoder Dec_B receives the signal $IN3_B$ and the signal $IN4_B$, and then decodes the signal $IN3_B$ and the signal $IN4_B$.

Depending on the result of the decoding, the decoder Dec_B selects, from the i signal lines BG, the signal lines BG corresponding to a particular block BLK to apply the voltage from the fourth switch part. The voltage $V4_B$ is supplied to a level shifter that is provided in the decoder Dec_B.

Next, an equivalent circuit of the above-described decoder part 32 is explained using FIG. 9. For the decoder part 32 explained in the following, n=4; that is, the decoder part 32 is an example of a configuration of the case where the block BLK sharing number is 4. As an example, the case of the decoder Dec_S is explained. That is, it will be obvious that the number of parts that configure the decoder part 32 to be explained in the following will increase or decrease depending on the sharing number.

The decoder part 32 holds inverters inv60 and inv61, NAND circuits 70-73, MUX circuits 80-84, level shifters LS90-LS93, and n-channel MOS transistors Tr100-Tr147.

The signal IN3 is supplied to an input terminal of the inverter inv60 via the node N50; and an output terminal of the inverter inv60 is connected to the node N51. The signal IN4 is supplied to an input terminal of the inverter inv61 via the node N52; and an output terminal of the inverter inv61 is connected to the node N53.

The NAND circuit 70 NAND-operates a voltage level of the node N50 and a voltage level of the node N52, and outputs this NAND-operation result to the MUX circuit 80.

The NAND circuit 71 NAND-operates a voltage level of the node N51 and a voltage level of the node N53, and outputs this NAND-operation result to the MUX circuit 81.

The NAND circuit 72 NAND-operates the voltage level of the node N50 and the voltage level of the node N52, and outputs this NAND-operation result to the MUX circuit 82.

The NAND circuit 73 NAND-operates the voltage level of the node N51 and the voltage level of the node N53, and outputs this NAND-operation result to the MUX circuit 83.

According to the control signal t2 and the control signal t3, the MUX circuit 84 outputs either a voltage V or a ground potential (0 V). For example, in a case where all blocks BLK are selected such as the case of an erase operation, according to the control signal t2 and the control signal t3, the MUX circuit 84 selects a voltage V5 and outputs the selected voltage V to the MUX circuits 80-83.

The signal t2 is a switch signal switching which potential among an input potential V5 and a voltage VSS (low voltage: an inverse triangle in the drawing) of the MUX circuit 84 is to be sent to the MUX circuit 80-MUX circuit 83.

Further, the signal t3 is a signal determining, with respect to the MUX circuit 80-MUX circuit 83, to which MUX circuit to apply or not to apply a voltage. The number of bits also changes depending on the block BLK sharing number n.

The MUX circuit 80 selects one of the NAND operation result from the NAND circuit 70 and the voltage level from the MUX circuit 84 based on the control signal t1. In a normal operation, the MUX circuit 80 selects the NAND operation result from the NAND circuit 70 according to the control signal t1. In the case where all blocks BLK are selected such as the case of an erase operation, the MUX circuit 80 selects the voltage level of the MUX circuit 84 according to the control signal t1. The same applies to the MUX circuits 81-83.

The MUX circuit 81 selects one of the NAND operation result from the NAND circuit 71 and the voltage level from the MUX circuit 84 based on the control signal t1. The MUX circuit 82 selects one of the NAND operation result from the NAND circuit 72 and the voltage level from the MUX circuit 84 based on the control signal t1. The MUX circuit 83 selects one of the NAND operation result from the NAND circuit 73 and the voltage level from the MUX circuit 84 based on the control signal t1.

The level shifter 90 boosts a signal supplied from the MUX circuit 80 by a voltage V1. Subsequently, the level shifter 90 supplies the boosted voltage to gates of corresponding MOS transistor 100-MOS transistor 111 (MOSTr100-111).

For example, when the signal supplied from the MUX circuit 80 is the "H" level, each of the MOS transistors 100-111 is put in the ON state, and the voltages (such as the voltage $V2_S$ and the voltage $V3_S$) applied from the voltage switch part 31 are applied to the Xfer_S and Xfer_D via these MOS transistors 100-111. In this case, the other MOS transistors 112-147 (MOSTr112-147) are put in the OFF state.

The level shifter 91 boosts a signal supplied from the MUX circuit 81 by the voltage V1. Subsequently, the level shifter 91 supplies the boosted voltage to gates of corresponding MOS transistor 112-MOS transistor 123 (MOSTr112-123).

For example, when the signal supplied from the MUX circuit 81 is the "H" level, each of the MOS transistors 112-123 is put in the ON state, and the voltages (such as the voltage $V2_D$ and the voltage $V3_D$) applied from the voltage switch part 31 are applied to the Xfer_S and Xfer_D via these MOS transistors 112-123. In this case, the other MOS transistors 100-111 and the MOS transistors 124-147 are put in the OFF state. The same applies to the level shifters 92 and 93 and thus their explanation is omitted.

Effects According to First Embodiment

The following effects can be obtained in a nonvolatile semiconductor memory device according to the first embodiment of the present disclosure. (1) The area of the peripheral circuit can be reduced. As described above, in the first embodiment, a plurality of blocks BLK are shared, and one block decoder BD is arranged for the plurality of blocks BLK. Therefore, the number of the block decoders BD provided in the nonvolatile semiconductor memory device can be reduced. For example, when the number of sharing units of the blocks BLK is n=2, the number of the arranged block decoders BD is reduced by half; and when the number of sharing units is n=4, the number of the arranged block decoders BD is further reduced by half again.

Figures 10A, 10B, 10C:
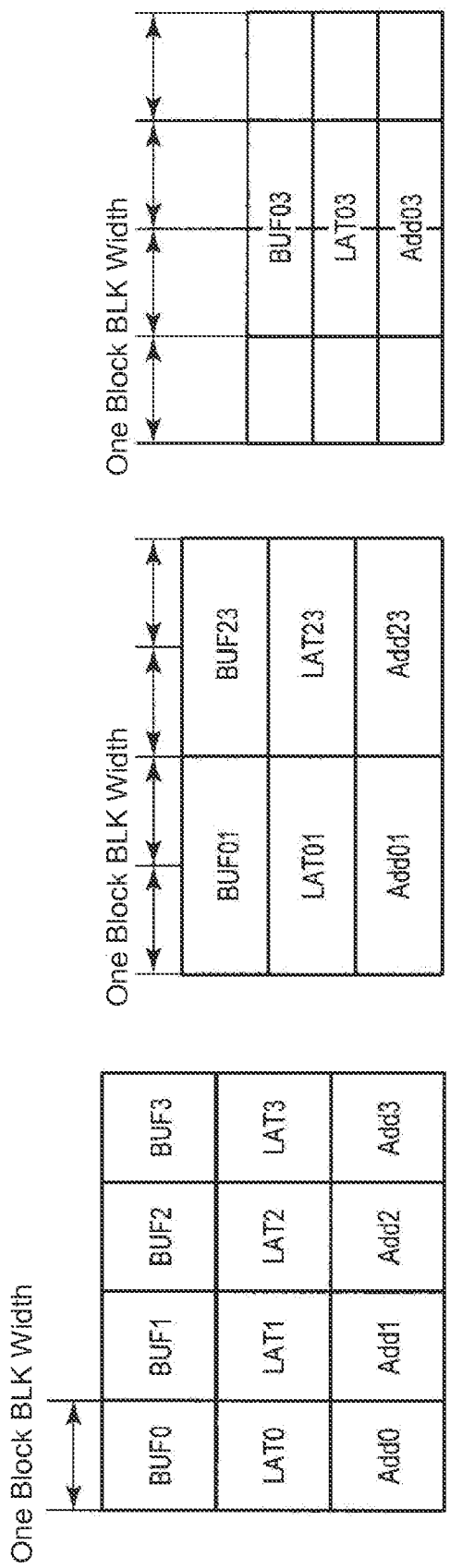
FIGS. 10A-10C are conceptual diagrams illustrating effects according to the first embodiment.

FIGS. 10A-10C illustrate conceptual diagrams showing the reduction of the area. FIG. 10A illustrates the case of a nonvolatile semiconductor memory device as a comparative example where the sharing number n=1, that is, one block decoder BD is provided for each block BLK. FIG. 10B illustrates the case where the sharing number n=2 in the first embodiment; and FIG. 10C illustrates the case where the sharing number n=4.

As illustrated in FIG. 10A, in the case where, without sharing a plurality of blocks BLK, one block decoder BD is arranged for each block BLK, the above-described inverters inv20-inv22 (indicated as BUF0, BUF1, . . . in FIG. 10A), latch circuits LAT (indicated as LAT0, LAT1, . . . in FIG. 10A), and address decoder parts 41 (indicated as Add0, Add1, . . . in FIG. 10A) are arranged for each block BLK. The lateral direction illustrates the width of the block BLK. On the other hand, as illustrated in FIG. 10B, when the sharing number n=2, the latch circuit LAT1, inverter inv20-inv22 and address decoder part 41 are provided for a plurality of sharing blocks BLK, and therefore the numbers of the provided latch circuit LAT1, inverter inv20-inv22 and address decoder part 41 are reduced according to the sharing number n. That is, as illustrated in FIG. 10B, when the sharing number n=2, the latch circuit LAT1, inverter inv20-inv22 and address decoder part 41 are provided for every two blocks BLK. Therefore, the area occupied is about half of that of the comparative example.

Further, as illustrated in FIG. 10C, when the sharing number n=4, the latch circuit LAT1, inverter inv20-inv22 and address decoder part 41 are provided for every four blocks BLK. Therefore, the area occupied is about ¼ of that of the comparative example.

Therefore, it is clear that, as a whole, the area occupied by the block decoder BD reduces as the sharing number n decreases. In the first embodiment, the optimal value of the sharing number is n=4. Newly added circuit parts can be accommodated under the cell array 10. Therefore, even when the circuit is enlarged, a chip area does not increase. Therefore, an effect of reducing the area of the block decoder BD can be produced.

(2) Wirings arranged under the memory cell array can be reduced.

In FIG. 5, for convenience, the Xfer_D and the Xfer_S are collectively indicated. However, in practice, as illustrated in FIG. 1, the Xfer_S and the Xfer_D are positioned at two ends of the memory cell array. As described above, the block decoder BD is connected to the Xfer_S and the Xfer_D via wirings so as to select MOS transistor groups in the Xfer_D and the Xfer_S. Here, the comparative example is explained. In the comparative example, a nonvolatile semiconductor memory device is assumed in which, without sharing a plurality of blocks BLK, one block decoder BD is arranged for each one block BLK. That is, in order to select the Xfer_D and the Xfer_S that are positioned at the two ends of the block BLK, signal wirings supplying the signal BLKSEL and the signal BLKSELn from one block decoder BD are arranged.

As can also be seen from FIG. 1, the signal wirings (two wirings of the signal BLKSEL and the signal BLKSELn) connecting the block decoder BD and, for example, a gate of a MOS transistor in the Xfer_D pass through directly under where the memory cell array 10 is formed. That is, the more there are signal wirings passing through directly under the memory cell array 10, the more the area of the circuit arranged under the cell array is enlarged. In the case of the comparative example, the signal wirings (two wirings of the signal BLKSEL and the signal BLKSELn) connecting the block decoder BD and, for example, a gate of a MOS transistor in the Xfer_D are arranged for each block BLK.

However, in the case of the nonvolatile semiconductor memory device according to the present embodiment, as described above, the blocks BLK are shared. For example, when the sharing number n=2, the number of the arranged block decoders BD is half of that of the comparative example. That is, the number of signal wirings from the block decoder BD to, for example, the Xfer_D is also half of that of the comparative example.

As described above, by increasing the number of sharing blocks, the number of wirings added directly under the memory cell array 10 is reduced. This allows the area of the circuit arranged under the cell array to be reduced.

Based on the above description, FIG. 11 illustrates a conceptual depicts how the number of the signal wirings (signal BLKSEL and signal BLKSELn) is reduced when the number n of sharing blocks is increased. In FIG. 11, not only the numbers of the signal BLKSEL and the signal BLKSELn wirings, the numbers of the signal lines SGS, the signal lines SGD and the signal lines CG are also mentioned. Further, the total number of blocks arranged in the MAT11 is assumed to be 1000.

As illustrated in FIG. 11, the number of sharing blocks (the sharing number n), the number of memory cells MC laminated in one semiconductor layer SC, the number of signal lines SGS, the number of signal lines SGD, the number of signal lines CG, the number of signal wirings (BLKSEL and BLKSELn) are indicated; the respective numbers of the signal lines when the sharing number n is increased are indicated. The number of the memory cells MC laminated in one semiconductor layer SC is assumed to be 24. That is, the memory string MS is configured by the memory cell MC0-memory cell MC47.

As illustrated in FIG. 11, in the case of the nonvolatile semiconductor memory device of the comparative example (in which the sharing number n=1), as described above, one block decoder BD is arranged for each block BLK. Therefore, the numbers of the signal wirings (the number of signal lines for the signal BLKSEL and the number of signal lines for the signal BLKSELn) are equal to the number of the blocks BLK, that is, each of the numbers is 1000. Further, in the comparative example, the signal lines SGS, the signal lines SGD and the signal lines CG are commonly connected at all blocks BLK. Therefore, as illustrated in FIG. 11, the numbers of these signal lines are respectively, from the top, 12, 12, and 48.

On the other hand, when the sharing number n=2, as described above, each of the numbers of the signal wirings (the number of signal lines for the signal BLKSEL and the number of signal lines for the signal BLKSELn) is 500. In this case, the numbers of the signal lines SGS, the signal lines SGD and the signal lines CG that are drawn from the sharing blocks BLK (for example, the block BLK0 and the block BLK1) are respectively doubled as compared to the comparative example. However, when the nonvolatile semiconductor memory device is viewed as a whole, only 1168 signal lines are required, which is approaching half of that of the comparative example (2096 signal line).

Similarly, the case where the sharing number n=4 is explained. In this case, one block decoder BD is provided for each of the block BLK0-block BLK3 group, the block BLK4-block BLK7 group, . . . , and the block BLK(i−4)-block BLK(i−1) group. Therefore, each of the numbers of the signal wirings (the number of signal lines for the signal BLKSEL and the number of signal lines for the signal BLKSELn) from the block decoder BD to the Xfer_D is 250. In this case, the signal lines SGS, the signal lines SGD and the signal lines CG are drawn from the sharing blocks BLK (for example, the block BLK0-block BLK3). Therefore, the numbers of these signal lines are respectively four times of that of the comparative example (in FIG. 11, 48, 48, and 192, from the top).

However, when the nonvolatile semiconductor memory device is viewed as a whole, only 812 signal lines are required, which is about 1200 signal lines less than that of the comparative example (2096 signal lines).

(3) All blocks BLK can be selected.

In the case of the nonvolatile semiconductor memory device according to the first embodiment, in which the sharing number n=4, the signal lines SGS and the signal lines SGD are separately drawn from the four sharing blocks BLK. That is, 48 signal lines SGS and 48 signal lines SGD are drawn as compared to 12 signal lines SGS and 12 signal lines SGD in the case of the comparative example. In without additional elements to the configuration, the desired voltage application in the first embodiment could only be performed on one block BLK of the four sharing blocks BLK. That is, in this case, selecting all blocks BLK would not be possible. Further, separating accessible and not-accessible blocks BLK also could not be performed.

This can also be seen from the configuration of the MUX circuits and the MOS transistor 100-MOS transistor 147 corresponding to the MUX circuits in FIG. 9.

Taking this point into consideration, in the first embodiment, the MUX circuit 84 and the control signal t2 and control signal t3 that control the MUX circuit 84 are further provided in FIG. 9.

As described above, the MUX circuit 84 has a function of supplying the voltage V5 to each of the MUX circuits 80-83 according to the control signals t2 and t3 in the case of selecting all the blocks BLK, In this case, according to the control signal t1, each of the MUX circuit 80-MUX circuit 83 selects the voltage level supplied by MUX circuit 84 regardless of the outputs of the NAND circuits 70-73.

That is, in the case of selecting all the blocks BLK, the voltage V5 is output from the MUX circuit 80-MUX circuit 83 and all of the corresponding MOS transistor 100-MOS transistor 147 are put in the ON state. Therefore, selecting all the blocks BLK can be performed, and even when the signal lines SGS and the signal lines SGD are separately drawn, therefore, for example, an erase operation and the like can be executed.

Second Embodiment

Figure 12:
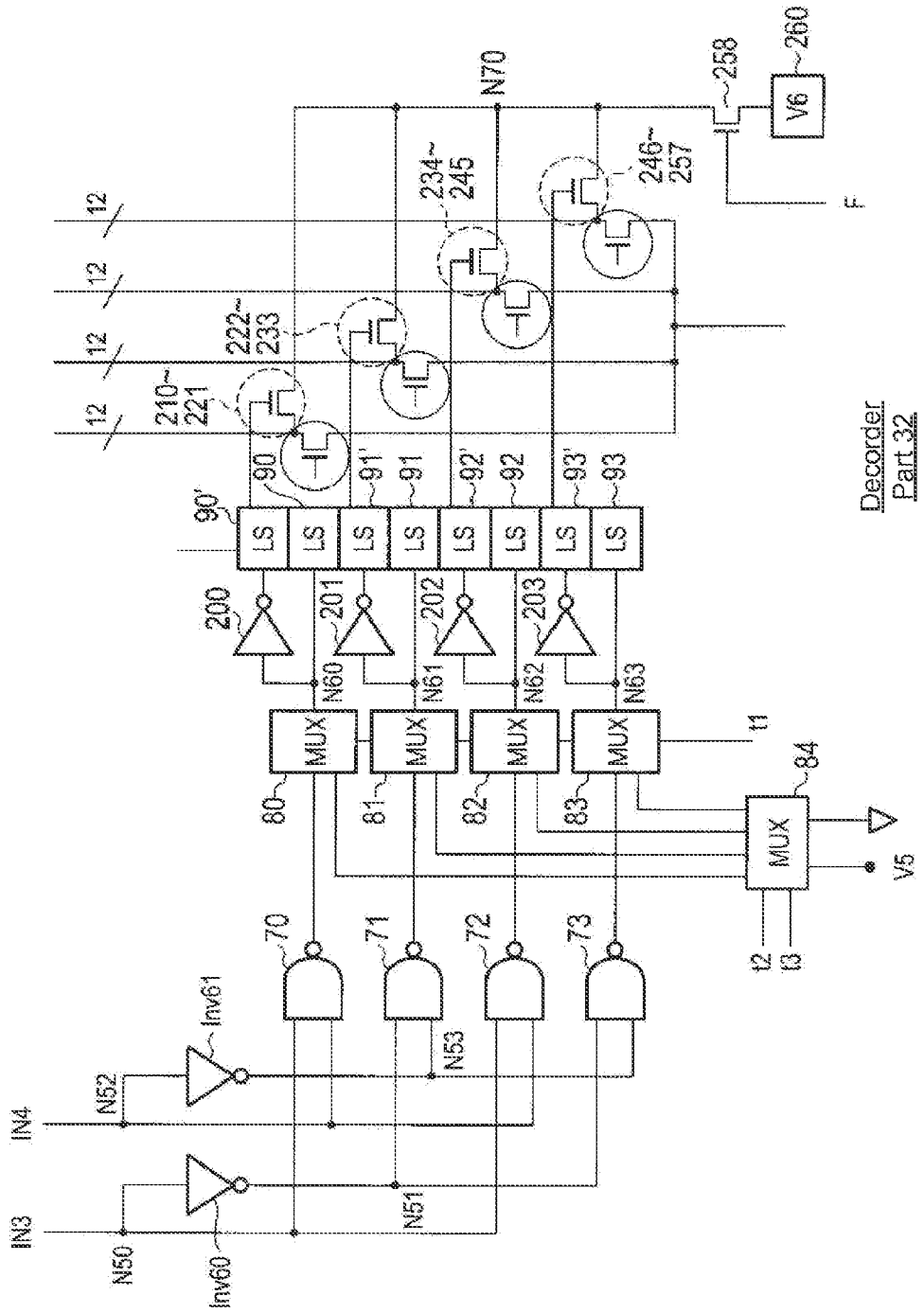
FIG. 12 illustrates a circuit diagram of a decoder part according to a second embodiment.

Next, a nonvolatile semiconductor memory device according to a second embodiment is explained. The nonvolatile semiconductor memory device according to the second embodiment is different in the configuration of the decoder part 32. In the case of the nonvolatile semiconductor memory device according to the second embodiment, a voltage can be supplied to a non-selection block BLK. In the following, a configuration of a decoder part 32 according to the second embodiment is illustrated in FIG. 12. Only where the configuration is different from that of the above FIG. 9 is explained. As an example of the decoder part 32, the case of the above-described decoder Dec_S is explained.

Decoder Part 32—Second Embodiment

As illustrated in FIG. 12, the decoder part 32 according to the second embodiment further comprises inverters inv200-203, level shifters LS90'-LS93, n-channel MOS transistor 210-MOS transistor 258, and a voltage generating part 260. The case where the number of sharing blocks BLK is four (n=4) is explained.

An input terminal of the inverter inv200 is connected to a node N60 and an output terminal of the inverter inv200 is connected to the level shifter LS90'. The level shifter LS90' receives input from the inverter inv200, and, according to the input, supplies a boosted voltage to gates of the MOS transistors 210-221. Further, one end of current paths of the MOS transistors 210-221 are respectively connected to one end of current paths of the corresponding MOS transistor 100-MOS transistor 111, and the other ends of the current paths of the MOS transistors 210-221 are connected to a node N70.

An input terminal of the inverter inv201 is connected to a node N61 and an output terminal of the inverter inv201 is connected to the level shifter LS91'. The level shifter LS91' receives input from the inverter inv201, and, according to the input, supplies a boosted voltage to gates of the MOS transistors 222-233. Further, one end of current paths of the MOS transistors 222-233 are respectively connected to one end of current paths of the corresponding MOS transistor 112-MOS transistor 123, and the other end of the current paths of the MOS transistors 222-233 are connected to the node N70.

An input terminal of the inverter inv202 is connected to a node N62 and an output terminal of the inverter inv202 is connected to the level shifter LS92'. The level shifter LS92' receives input from the inverter inv202, and, according to the input, supplies a boosted voltage to gates of the MOS transistors 234-245. Further, one end of current paths of the MOS transistors 234-245 are respectively connected to one end of current paths of the corresponding MOS transistor 124-MOS transistor 135, and the other end of the current paths of the MOS transistors 234-245 are connected to the node N70.

An input terminal of the inverter inv203 is connected to a node N63 and an output terminal of the inverter inv203 is connected to the level shifter LS93'. The level shifter LS93' receives input from the inverter inv203, and, according to the input, supplies a boosted voltage to gates of the MOS transistors 246-257. Further, one end of current paths of the MOS transistors 246-257 are respectively connected to one end of current paths of the corresponding MOS transistor 136-MOS transistor 146, and the other end of the current paths of the MOS transistors 246-257 are connected to the node N70.

Further, when the voltage generating part 260 receives a signal F and the MOS transistor 258 is put in an ON state, the voltage generating part 260 supplies a voltage V3 (for example, the voltage VDD and the voltage VSS) to the node N70. That is, when the MOS transistors 210-257 are put in the ON state by the level shifters LS90'-93', even when a result of decoding a signal IN5 and a signal IN6 is a non-selection block BLK, the voltage V3 can be supplied.

In the explanation of the decoder part 32 described above, as an example, the case of the decoder Dec_S is explained. However, the decoder Dec_D or the decoder Dec_C may also be similarly explained.

Effects According to Second Embodiment

In the case of the nonvolatile semiconductor memory device according to the second embodiment, in addition the above-described effects (1)-(3), an effect (4) can be further obtained.

(4) An erroneous operation can be inhibited.

That is, in the second embodiment, the level shifters LS90'-93', the voltage generating circuit 260, and the MOS transistors 210-358 are further provided.

Therefore, as described above, even when the MUX circuits 80-83 are put at the "L" level, one of the MOS transistors 210-257 is put in the ON state by the output of the inverters inv200-203, and a voltage can be supplied to a non-selection block BLK. In this way, by applying a certain voltage a non-selection block BLK, an erroneous operation can be inhibited.

Third Embodiment

Next, a nonvolatile semiconductor memory device according to a third embodiment is explained. The third embodiment has a configuration in which level shifters LS are provided in the Xfer_S and the Xfer_D. The level shifters LS are provided for each of the blocks BLK. The Xfer_S and the Xfer_D have the same configuration. Therefore, in the following embodiment, the Xfer_S is explained using a simplified block diagram.

Simplified Diagram of Xfer_S

Figure 13:
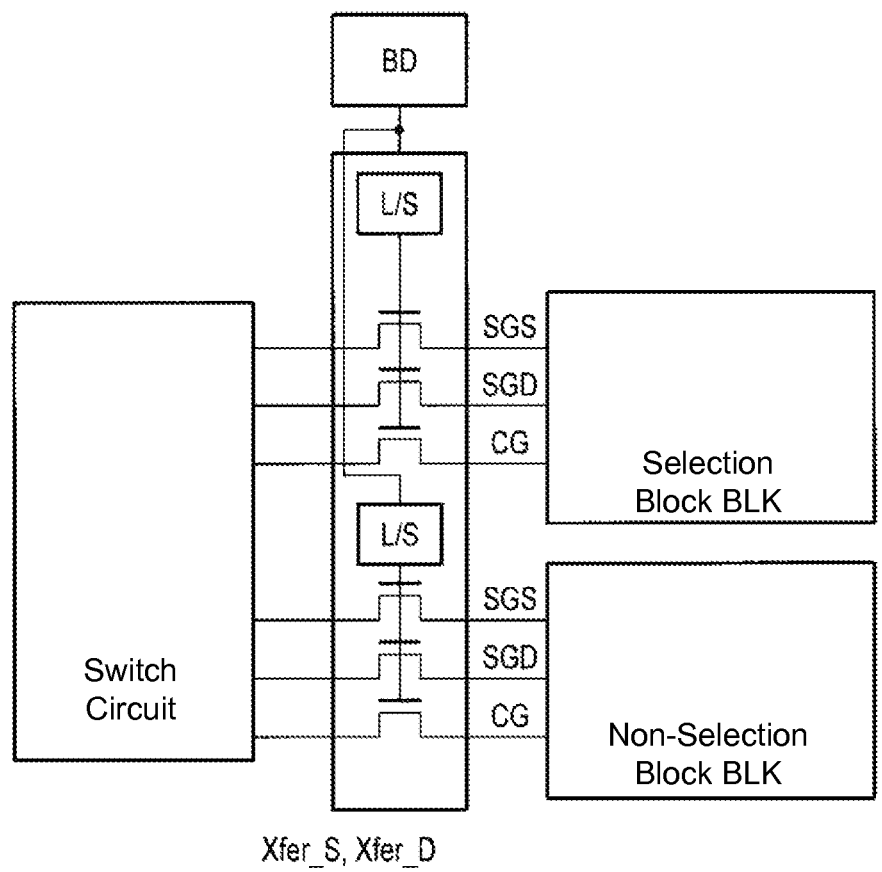
FIG. 13 is a conceptual connection diagram of blocks, an Xfer_S, an Xfer_D, and a peripheral circuit according to a third embodiment.

As illustrated in FIG. 13, in addition to the MOS transistor groups (MOS transistors $Tr_{SGD}$, $Tr_{SGS}$, $Tr_{MC}$, and the like illustrated in FIG. 5), the Xfer_S is provided the level shifters LS.

The signal BLKSEL and signal BLKSELn that are supplied from the block decoder BD are input to the level shifters LS. The level shifters LS change the value of a voltage supplied from the block decoder BD from a high voltage to a low voltage. The level shifters LS then supply the low voltage to the MOS transistor groups (e.g., MOSTr 100-148).

Effects According to Third Embodiment

In the case of the nonvolatile semiconductor memory device according to the third embodiment, in addition the above-described effects (1)-(4), an effects (5) and (6) can be further obtained.

(5) Power consumption can be reduced.

In the case of the nonvolatile semiconductor memory device according to the third embodiment, the level shifters LS are provided in the Xfer_S and the Xfer_D. The voltage that is applied to the gates of the MOS transistor Tr groups is lowered by the level shifters LS. Therefore, the power consumption applied to the gates of the MOS transistor groups (MOSTr) in the Xfer_S and the Xfer_D can be reduced.

Further, without wastefully applying a high voltage on the gates of the MOS transistor groups, the life of the peripheral circuit 20 can be extended.

(6) Distance between adjacent wirings can be decreased.

As explained in the above, the voltage supplied from the level shifters LS is a low voltage. Therefore, the voltage condition between the wirings is relaxed. That is, in the case of a high voltage, the shorter the inter-wiring distance is, the more likely that a wiring will be affected by the voltage of an adjacent wiring (e.g., by capacitive coupling). Therefore, it is necessary to increase the distance between adjacent wirings.

However, in the case of the nonvolatile semiconductor memory device according to the third embodiment, since the voltage is low, the distance between adjacent wirings can be decreased. That is, an overall area reduction can be achieved. While certain embodiments have been described, these embodiments have been presented by way of example only; and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirits of the inventions.

Structure of the memory cell array is not limited as above description. A memory cell array formation may be as disclosed in U.S. patent application Ser. No. 12/532,030, the entire contents of which are incorporated by reference herein.

What is claimed is:

1. A nonvolatile semiconductor memory device, comprising:
   a memory cell array including a first block and a second block, the first block including a first memory string, the first memory string including a first selection transistor and a plurality of first memory cells connected in series, the second block including a second memory string, the second memory string including a second selection transistor and a plurality of second memory cells connected in series;
   a plurality of first transfer transistors connected to gates of the plurality of first memory cells and a gate of the first selection transistor;
   a plurality of second transfer transistors connected to gates of the plurality of second memory cells and a gate of the second selection transistor;
   a third transfer transistor having a first end connected to an end of one of the first transfer transistors and the gate of the first selection transistor;
   a fourth transfer transistor having a first end connected to an end of one of the second transfer transistors and the gate of the second selection transistor; and
   a first block decoder configured to output a first selection signal to gates of the first and second transfer transistors and a first non-selection signal to gates of the third and fourth transfer transistors, a first output of the first block decoder being connected to the gates of the first and second transfer transistors and a second output of the first block decoder being connected to the gates of the third and fourth transfer transistors.

2. The nonvolatile semiconductor memory device according to claim 1, wherein the memory cell array further includes a third memory block and a fourth memory block, the third memory block including a third memory string, the third memory string including a plurality of third memory cells connected in series, the fourth block including a fourth memory string, the fourth memory string including a plurality of fourth memory cells connected in series, and the nonvolatile semiconductor memory device further comprises:
   a plurality of fifth transfer transistors connected to gates of the plurality of third memory cells;
   a plurality of sixth transfer transistors connected to gates of the plurality of fourth memory cells; and
   a second block decoder configured to output a second selection signal to the pates of the third and fourth transfer transistors, an output of the second block decoder being connected to the gates of the third and fourth transfer transistors.

3. The nonvolatile semiconductor memory device according to claim 1, wherein
   the first memory string further includes a third selection transistor, the first selection transistor being connected to a first end of the plurality of the first memory cells, and the third selection transistor being connected to a second end of the plurality of the first memory cells, and
   the second memory string further includes a fourth selection transistor, the second selection transistor being connected to a first end of the plurality of the second memory cells, and the fourth selection transistor being connected to a second end of the plurality of the second memory cells.

4. The nonvolatile semiconductor memory device according to claim 2, wherein
   the third memory string further includes fifth and sixth selection transistors, the fifth selection transistor being connected to a first end of the plurality of the third memory cells, and the sixth selection transistor being connected to a second end of the plurality of the third memory cells, and
   the fourth memory string further includes seventh and eighth selection transistors, the seventh selection transistor being connected to a first end of the plurality of the fourth memory cells, and the eighth selection transistor being connected to a second end of the plurality of the fourth memory cells.

5. The nonvolatile semiconductor memory device according to claim 4, further comprising:
   a first signal line group connected to gates of the first, third, fifth, and sixth selection transistors; and a second signal line group connected to gates of the second, fourth, seventh, and eighth selection transistors.

6. The nonvolatile semiconductor memory device according to claim 1, wherein
the first selection transistor is at a first end of the first memory string and a third selection transistor is at a second end of the first memory string,
the second selection transistor is a first end of the second memory string and a fourth selection transistor is at a second end of the second memory string,
a fifth transfer transistor has a first end connected to a gate of the third selection transistor and a second end connected to a first potential node,
a sixth transfer transistor has a first end connected to a gate of the fourth selection transistor and a second end connected to the first potential node, and
gates of the fifth and sixth transfer transistors are connected to the second output of the first block decoder.

7. The nonvolatile semiconductor memory device according to claim 6, wherein the third and fourth transfer transistors each have a second end connected to a second potential node that has a potential that is different from the first potential node.

8. The nonvolatile semiconductor memory device according to claim 6, wherein the first block decoder is configured to output the first non-selection signal to the fifth and sixth transfer transistors, a first end of the fifth transfer transistor being connected to a first end of one of the first transfer transistors, a first end of the sixth transfer transistor being connected to a first end of one of the second transfer transistors.

* * * * *